(12) United States Patent
Lee et al.

(10) Patent No.: US 12,094,855 B2
(45) Date of Patent: Sep. 17, 2024

(54) PIXEL AND DISPLAY DEVICE HAVING THE SAME

(71) Applicant: Samsung Display Co., LTD., Yongin-si (KR)

(72) Inventors: Hyun Wook Lee, Yongin-si (KR); Ki Nyeng Kang, Yongin-si (KR); Jin Taek Kim, Yongin-si (KR); Tae Woo Kim, Yongin-si (KR); Hee Keun Lee, Yongin-si (KR); Kyung Tae Chae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 168 days.

(21) Appl. No.: 17/210,985

(22) Filed: Mar. 24, 2021

(65) Prior Publication Data

US 2021/0407970 A1 Dec. 30, 2021

(30) Foreign Application Priority Data

Jun. 30, 2020 (KR) .................... 10-2020-0080584

(51) Int. Cl.
*H01L 29/20* (2006.01)
*H01L 25/075* (2006.01)
*H01L 27/12* (2006.01)
*H01L 33/00* (2010.01)
*H01L 33/62* (2010.01)

(52) U.S. Cl.
CPC ...... *H01L 25/0753* (2013.01); *H01L 27/1214* (2013.01); *H01L 33/62* (2013.01)

(58) Field of Classification Search
CPC . H01L 25/0753; H01L 27/1214; H01L 33/62; H01L 27/124; H01L 27/1255; H01L 25/167; H01L 27/3246; H01L 27/3248; H01L 51/5203; H01L 51/5262; H01L 51/5281; H01L 23/498
See application file for complete search history.

(56) References Cited

U.S. PATENT DOCUMENTS

| 10,026,777 B2 | 7/2018 | Kang et al. |
| 2018/0019426 A1* | 1/2018 | Im ................. H01L 25/0753 |
| 2018/0175106 A1* | 6/2018 | Kim ................ H01L 33/385 |

(Continued)

FOREIGN PATENT DOCUMENTS

| KR | 10-2018-0071465 | 6/2018 |
| KR | 10-2020-0041430 | 4/2020 |
| KR | 10-2021-0141828 | 11/2021 |

*Primary Examiner* — Ismail A Muse
(74) *Attorney, Agent, or Firm* — KILE PARK REED & HOUTTEMAN PLLC

(57) ABSTRACT

A pixel may include a pixel circuit layer including at least one transistor and a first electrode disposed on a substrate, and a first insulating layer disposed on the at least one transistor and the first electrode, and a display element layer disposed on the pixel circuit layer, the display element layer including a second electrode electrically connected to the at least one transistor, and a plurality of light emitting elements electrically connected to each of the first and second electrodes. The first electrode and the second electrode may be disposed on different layers and may be spaced apart from each other. The plurality of light emitting elements may overlap the first and second electrodes in a plan view and a cross-sectional view.

20 Claims, 26 Drawing Sheets

(56) References Cited

U.S. PATENT DOCUMENTS

2020/0124986 A1     4/2020   Lee et al.
2021/0359167 A1    11/2021   Lee et al.
2022/0077356 A1*   3/2022   Do .......................... H01L 33/20

* cited by examiner

PIXEL AND DISPLAY DEVICE HAVING THE SAME

TECHNICAL FIELD

The disclosure relates to a pixel and a display device having the same.

BACKGROUND ART

As interest in an information display is increasing and a demand for using a portable information media is increasing, a demand and commercialization for a display device are being focused.

DESCRIPTION

Technical Problem

An object of the disclosure is to provide a pixel capable of improving light output efficiency while improving a short defect between two adjacent electrodes.

In addition, an object of the disclosure is to provide a display device having the above-described pixel.

Technical Solution

A pixel according to an embodiment of the disclosure may include a pixel circuit layer including at least one transistor and a first electrode disposed on the substrate, and a first insulating layer disposed on the transistor and the first electrode, and a display element layer disposed on the pixel circuit layer and including a second electrode electrically connected to the transistor, and a plurality of light emitting elements electrically connected to each of the first and second electrodes. Here, the first electrode and the second electrode may be disposed on different layers and may be electrically separated. In addition, the light emitting elements may overlap the first and second electrodes on a plan view and a cross-sectional view.

In an embodiment of the disclosure, the first electrode and the second electrode may be spaced apart at a distance in a first direction on the plan view.

In an embodiment of the disclosure, the first electrode and the second electrode may overlap each other on the plan view.

In an embodiment of the disclosure, the second electrode may be disposed on the first electrode with the first insulating layer interposed between the second electrode and the first electrode.

In an embodiment of the disclosure, a width of a first direction of the first electrode may be greater than a width of the first direction of the second electrode on the plan view and the cross-sectional view.

In an embodiment of the disclosure, the first electrode may be provided in a plate shape between the pixel circuit layer and the display element layer.

In an embodiment of the disclosure, the first electrode may include an opaque conductive material, and the second electrode may include a transparent conductive material.

In an embodiment of the disclosure, a width of an overlap region of the first and second electrodes of the first direction may be less than the width of the first direction of the first electrode.

In an embodiment of the disclosure, the display element layer may further include a second insulating layer disposed on the second electrode, a first contact electrode electrically connecting the first electrode and each of the light emitting elements, and a second contact electrode electrically connecting the second electrode and each of the light emitting element, and the light emitting elements may be disposed on the second insulating layer.

In an embodiment of the disclosure, the pixel may further include a third electrode disposed on the pixel circuit layer, the second electrode and the third electrode may be provided on the same layer, and each of the second and third electrodes and the first electrode may be spaced apart from each other with the first insulating layer between each of the second and third electrodes and the first electrode.

In an embodiment of the disclosure, the light emitting elements may include first light emitting elements overlapping the first and second electrodes and electrically connected to each of the first and second electrodes on the plan view and the cross-sectional view, and second light emitting elements overlapping the first and third electrodes and electrically connected to each of the first and third electrodes on the plan view and the cross-sectional view.

In an embodiment of the disclosure, the second electrode, the first electrode, and the third electrode may be sequentially arranged in the first direction, on the plan view, and each of the first to third electrodes may be spaced apart from an adjacent electrode in the first direction.

In an embodiment of the disclosure, the first electrode may overlap each of the second and third electrodes on the plan view.

In an embodiment of the disclosure, a width of the first direction of the first electrode may be greater than a width of the first direction of each of the second and third electrodes.

In an embodiment of the disclosure, the first electrode may include a (1-1)th electrode, a (1-2)th electrode, a (1-3)th electrode, and a (1-4)th electrode spaced apart from each other on the pixel circuit layer, the second electrode may include a (2-1)th electrode, a (2-2)th electrode, and a (2-3)th electrode spaced apart from each other on the substrate, the (1-1)th electrode, the (2-1)th electrode, the (1-2)th electrode, the (2-2)th electrode, the (1-3)th electrode, the (2-3)th electrode, and the (1-4)th electrode may be sequentially arranged in the first direction on the plan view and the cross-sectional view, and the first electrode and the second electrode may be spaced apart in the first direction on the plan view.

In an embodiment of the disclosure, the light emitting elements may include first light emitting elements provided between the (1-1)th electrode and the (2-1)th electrode on the plan view, second light emitting elements provided between the (2-1)th electrode and the (1-2)th electrode on the plan view, third light emitting elements provided between the (1-2)th electrode and the (2-2)th electrode on the plan view, fourth light emitting elements provided between the (2-2)th electrode and the (1-2)th electrode on the plan view, fifth light emitting elements provided between the (1-3)th electrode and the (2-3)th electrode on the plan view, and sixth light emitting elements provided between the (2-3)th electrode and the (1-4)th electrode on the plan view.

In an embodiment of the disclosure, the first electrode may include a (1-1)th electrode, a (1-2)th electrode, a (1-3)th electrode, and a (1-4)th electrode spaced apart from each other on the pixel circuit layer, and the second electrode may be provided in a plate shape overlapping a portion of the (1-1)th electrode, the (1-2)th electrode, the (1-3)th electrode, and the (1-4)th electrode.

A pixel according to another embodiment of the disclosure may include a substrate, a pixel circuit layer including at least one transistor and a first electrode disposed on the substrate, a first insulating layer disposed on the transistor and the first electrode, and a second electrode disposed on the first insulating layer and electrically connected to the transistor, and a display element layer disposed on the pixel circuit layer and including a plurality of light emitting elements electrically connected to each of the first and second electrodes. Here, the first electrode and the second electrode may be disposed on different layers and may be electrically separated. The light emitting elements may overlap the first and second electrodes on a plan view.

A display device according to an embodiment of the disclosure may include a substrate including a plurality of pixel areas, and a pixel provided in each of the pixel areas. The pixel may include a pixel circuit layer including at least one transistor and a first electrode disposed on the substrate, and a first insulating layer disposed on the transistor and the first electrode, and a display element layer disposed on the pixel circuit layer and including a second electrode electrically connected to the transistor, and a plurality of light emitting elements electrically connected to each of the first and second electrodes. Here, the first electrode and the second electrode may be disposed on different layers and may be electrically separated. In addition, the light emitting elements may overlap the first and second electrodes on a plan view and a cross-sectional view.

Effect of the Invention

A pixel and a display device having the same according to an embodiment of the disclosure may improve light output efficiency by efficiently aligning light emitting elements between two adjacent electrodes.

In addition, a pixel and a display device having the same according to an embodiment of the disclosure may improve reliability of light emitting elements by utilizing one electrode of the first and second electrodes as a shielding member blocking an electric field induced from configurations positioned below the one electrode.

Additionally, a pixel and a display device having the same may easily implement high resolution.

An effect according to an embodiment of the disclosure is not limited to the above, and more various effects are included in the present specification.

DETAILED DESCRIPTION OF THE EMBODIMENTS

Figure 1:
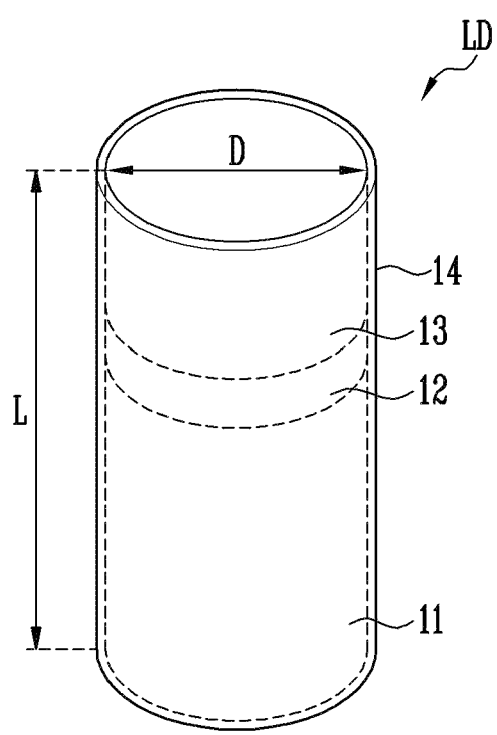
FIG. 1 is a perspective view schematically illustrating a light emitting element according to an embodiment of the disclosure.

The disclosure may be modified in various manners and have various forms. Therefore, specific embodiments will be illustrated in the drawings and will be described in detail in the specification. However, it should be understood that the disclosure is not intended to be limited to the disclosed specific forms, and the disclosure includes all modifications, equivalents, and substitutions within the spirit and technical scope of the disclosure.

Similar reference numerals are used for similar components in describing each drawing. In the accompanying drawings, the dimensions of the structures are shown enlarged from the actual dimensions for the sake of clarity of the disclosure. Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

It should be understood that in the present application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a film, an area, a plate, or the like is referred to as being "on" another portion, it includes not only a case where the portion is "directly on" another portion, but also a case where there is further another portion between the portion and another portion. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

In the present application, in a case where "a component (for example, 'a first component') is operatively or communicatively coupled with/to or "connected to" another component (for example, 'a second component'), the case should be understood that the component may be directly connected to the other component, or may be connected to the other component through another component (for example, a 'third component'). In contrast, in a case where a component (for example, 'a first component') is "directly coupled with/to or "directly connected" to another component (for example, 'a second component'), the case may be understood that another component (for example, 'a third component') is not present between the component and the other component.

Hereinafter, preferred embodiments of the disclosure and others necessary for those skilled in the art to understand the disclosure will be described in detail with reference to the accompanying drawings. In the following description, the singular expressions include plural expressions unless the context clearly dictates otherwise.

Figure 2:
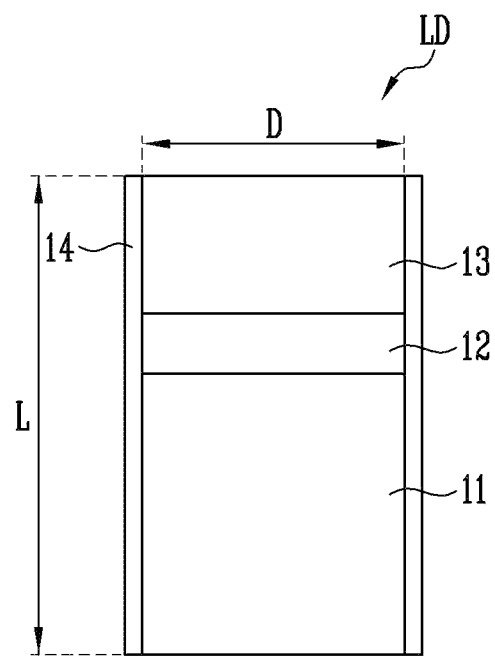
FIG. 2 is a cross-sectional view of the light emitting element of FIG. 1.

FIG. 1 is a perspective view schematically illustrating a light emitting element according to an embodiment of the disclosure, and FIG. 2 is a cross-sectional view of the light emitting element of FIG. 1.

In an embodiment of the disclosure, a type and/or a shape of the light emitting element are/is not limited to the embodiment shown in FIGS. 1 and 2.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, the light emitting element LD may implement a light emitting stack in which the first semiconductor layer 11, the active layer 12, and the second semiconductor layer 13 are sequentially stacked.

The light emitting element LD may be provided in a shape extending in one direction. When an extension direction of the light emitting element LD is referred to as a longitudinal direction, the light emitting element LD may include one end (or a lower end) and another end (or an upper end) along the extension direction. Any one of the first and second semiconductor layers 11 and 13 may be disposed at the one end (or the lower end) of the light emitting element LD, and the other one of the first and second semiconductor layers 11 and 13 may be disposed at the other end (or the upper end) of the light emitting element LD. For example, the first semiconductor layer 11 may be disposed at the one end (or the lower end) of the light emitting element LD, and the second semiconductor layer 13 may be disposed at the other end (or the upper end) of the light emitting element LD.

The light emitting element LD may be provided in various shapes. For example, the light emitting element LD may have a rod-like shape or a bar-like shape that is long in the longitudinal direction (that is, an aspect ratio is greater than 1). In an embodiment of the disclosure, a length L of the light emitting element LD in the longitudinal direction may be greater than a diameter D (or a width of a cross section) of the light emitting element LD. The light emitting element LD may include, for example, a light emitting diode (LED) manufactured to be extremely small to have the diameter D and/or the length L of about a micro scale or a nano scale.

The diameter D of the light emitting element LD may be 0.5 μm to 500 μm, and the length L may be about 1 μm to 10 μm. However, the diameter D and the length L of the light emitting element LD is not limited thereto. A size of the light emitting element LD may be changed to satisfy a requirement condition (or a design condition) of a lighting device or a light emitting display device to which the light emitting element LD is applied.

For example, the first semiconductor layer 11 may include at least one n-type semiconductor layer. For example, the first semiconductor layer 11 may include any one semiconductor material among InAlGaN, GaN, AlGaN, InGaN, AlN, and InN, and may be an n-type semiconductor layer doped with a first conductive dopant (or an n-type dopant) such as Si, Ge, or Sn. However, the material configuring the first semiconductor layer 11 is not limited thereto, and various materials may configure the first semiconductor layer 11. In an embodiment of the disclosure, the first semiconductor layer 11 may include a gallium nitride (GaN) semiconductor material doped with the first conductive dopant (or the n-type dopant). The first semiconductor layer 11 may include an upper surface contacting the active layer 12 along a direction of the length L of the light emitting element LD and a lower surface exposed to the outside. The lower surface of the first semiconductor layer 11 may be the one end (or the lower end) of the light emitting element LD.

The active layer 12 may be disposed on the first semiconductor layer 11 and may be formed in a single or multiple quantum wells structure. For example, when the active layer 12 is formed of in the multiple quantum wells structure, in the active layer 12, one barrier layer (not shown), a strain reinforcing layer, and a well layer may be periodically and repeatedly stacked as one unit. The strain reinforcing layer may have a lattice constant less than that of the barrier layer to further a reinforce strain, for example, a compression strain, applied to the well layer. However, a structure of the active layer 12 is not limited to the above-described embodiment.

The active layer 12 may emit light of a wavelength of 400 nm to 900 nm, and may use a double hetero structure. In an embodiment of the disclosure, a clad layer (not shown) doped with a conductive dopant may be formed on and/or under the active layer 12 along the direction of the length L of the light emitting element LD. For example, the clad layer may be formed of an AlGaN layer or an InAlGaN layer. According to an embodiment, a material such as AlGaN or InAlGaN may be used to form the active layer 12. In addition, various materials may form the active layer 12. The active layer 12 may include a first surface contacting the first semiconductor layer 11 and a second surface contacting the second semiconductor layer 13.

When an electric field of a predetermined voltage or more is applied to both ends of the light emitting element LD, the light emitting element LD emits light while an electron-hole pair is combined in the active layer 12. By controlling light emission of the light emitting element LD by using such a principle, the light emitting element LD may be used as a light source (or a light emitting source) of various light emitting devices including a pixel of the display device.

The second semiconductor layer 13 may be disposed on the second surface of the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a p-type semiconductor layer doped with a second conductive dopant (or a p-type dopant) such as Mg. However, the material configuring the second semiconductor layer 13 is not limited thereto, and various materials may configure the second semiconductor layer 13. In an embodiment of the disclosure, the second semiconductor layer 13 may include a gallium nitride (GaN) semiconductor material doped with the second conductive dopant (or the p-type dopant). The second semiconductor layer 13 may include a lower surface contacting the second surface of the active layer 12 along the direction of the length L of the light emitting element LD and an upper surface exposed to the outside. Here, the upper surface of the second semiconductor layer 13 may be the other end (or the upper end) of the light emitting element LD.

In an embodiment of the disclosure, the first semiconductor layer 11 and the second semiconductor layer 13 may have thicknesses different from each other in the direction of the length L of the light emitting element LD. For example, the first semiconductor layer 11 may have a thickness relatively thicker than that of the second semiconductor layer 13 along the direction of the length L of the light emitting element LD. Therefore, the active layer 12 of the light emitting element LD may be positioned more adjacently to the upper surface of the second semiconductor layer 13 than to the lower surface of the first semiconductor layer 11.

Meanwhile, although the first semiconductor layer 11 and the second semiconductor layer 13 are shown as being configured of one layer, the disclosure is not limited thereto. In an embodiment of the disclosure, according to the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer disposed between semiconductor layers having different lattice structures and serving as a buffer to reduce a difference of a lattice constant. The TSBR layer may be configured of a p-type semiconductor layer such as p-GaInP, p-AlInP, and p-AlGaInP, but the disclosure is not limited thereto.

According to an embodiment, the light emitting element LD may further include an additional electrode (not shown, hereinafter referred to as a first additional electrode) disposed on the second semiconductor layer 13 in addition to the above-described first semiconductor layer 11, active layer 12, and second semiconductor layer 13. In addition, according to another embodiment, the light emitting element LD may further include another additional electrode (not shown, hereinafter referred to as a second additional electrode) disposed at one end of the first semiconductor layer 11.

Each of the first and second additional electrodes may be an ohmic contact electrode, but the disclosure is not limited thereto. According to an embodiment, the first and second additional electrodes may be schottky contact electrodes. The first and second additional electrodes may include a conductive material. For example, the first and second additional electrodes may include an opaque metal using chromium (Cr), titanium (Ti), aluminum (Al), gold (Au), nickel (Ni), oxide thereof, alloy thereof, and the like alone or in combination, but the disclosure is not limited thereto. According to an embodiment, the first and second additional electrodes may also include transparent conductive oxide such as indium tin oxide (ITO), indium zinc oxide (IZO), zinc oxide (ZnO), indium gallium zinc oxide (IGZO), and indium tin zinc oxide (ITZO).

The materials included in the first and second additional electrodes may be the same as or different from each other. The first and second additional electrodes may be substantially transparent or translucent. Therefore, the light generated by the light emitting element LD may pass through the first and second additional electrodes and may be emitted to the outside of the light emitting element LD. According to an embodiment, when the light generated by the light emitting element LD does not pass through the first and second additional electrodes and is emitted to the outside of the light emitting element LD through a region except for the both ends of the light emitting element LD, the first and second additional electrodes may include an opaque metal.

In an embodiment of the disclosure, the light emitting element LD may further include an insulating film 14. However, according to an embodiment, the insulating film 14 may be omitted and may be provided so as to cover only a portion of the first semiconductor layer 11, the active layer 12, and the second semiconductor layer 13.

The insulating film 14 may prevent an electrical short that may occur when the active layer 12 is in contact with a conductive material other than the first and second semiconductor layers 11 and 13. In addition, the insulating film 14 may minimize a surface defect of the light emitting element LD to improve life and light emission efficiency of the light emitting element LD. In addition, when a plurality of light emitting elements LD are closely disposed, the insulating film 14 may prevent an unwanted short that may occur between the light emitting elements LD. When the active layer 12 may prevent an occurrence of a short with an external conductive material, presence or absence of the insulating film 14 is not limited.

The insulating film 14 may be provided in a form entirely surrounding an outer circumferential surface of the light emitting stack including the first semiconductor layer 11, the active layer 12, and the second semiconductor layer 13.

In the above-described embodiment, the insulating film 14 entirely surround the outer circumferential surface of each of the first semiconductor layer 11, the active layer 12, and the second semiconductor layer 13, but the disclosure is not limited thereto. According to an embodiment, when the light emitting element LD includes the first additional electrode, the insulating film 14 may entirely surround the outer circumferential surface of each of the first semiconductor layer 11, the active layer 12, the second semiconductor layer 13, and the first additional electrode. In addition, according to another embodiment, the insulating film 14 may not entirely surround the outer circumferential surface of the first additional electrode, or may surround only a portion of the outer circumferential surface of the first additional electrode and may not surround the remaining of the outer circumferential surface of the first additional electrode. In addition, according to an embodiment, when the first additional electrode is disposed at the other end (or the upper end) of the light emitting element LD and the second additional electrode is disposed at the one end (or the lower end) of the light emitting element LD, the insulating film 14 may expose at least one region of each of the first and second additional electrodes.

The insulating film 14 may include a transparent insulating material. For example, the insulating film 14 may include at least one insulating material selected from a group configured of silicon oxide (SiOx), silicon nitride (SiNx), silicon oxynitride (SiOxNy), aluminum oxide (AlOx), and titanium dioxide ($TiO_2$), but the disclosure is not limited thereto, and various materials having insulating properties may be used as the material of the insulating film 14.

According to an embodiment, the light emitting element LD may be implemented with a light emitting pattern of a core-shell structure. In this case, the above-described first semiconductor layer 11 may be positioned in a core, that is, a middle (or a center) of the light emitting element LD, the active layer 12 may be provided and/or formed in a form surrounding an outer circumferential surface of the first semiconductor layer 11, and the second semiconductor layer 13 may be provided and/or formed in a form surrounding an outer circumferential surface of the active layer 12. In addition, the light emitting element LD may further include an additional electrode (not shown) surrounding at least one side of the second semiconductor layer 13. In addition, according to an embodiment, the light emitting element LD may further include the insulating film 14 provided on an outer circumferential surface of the light emitting pattern of the core-shell structure and including a transparent insulating material. The light-emitting device LD implemented with the light-emitting pattern having the core-shell structure may be manufactured by a growth method.

The above-described light emitting element LD may be used as a light emitting source of various display devices. The light emitting element LD may be manufactured through a surface treatment process. For example, when a plurality of light emitting elements LD are mixed in a fluid solution (or solvent) and supplied to each pixel area (for example, a light emission area of each pixel or a light emission area of each sub pixel), surface treatment may be performed on each of the light emitting elements LD so that the light emitting elements LD may be uniformly sprayed without being uniformly aggregated in the solution.

A light emitting unit (or a light emitting device) including the light emitting element LD described above may be used in various types of electronic devices that require a light source, including a display device. For example, when a plurality of light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

Figure 3:
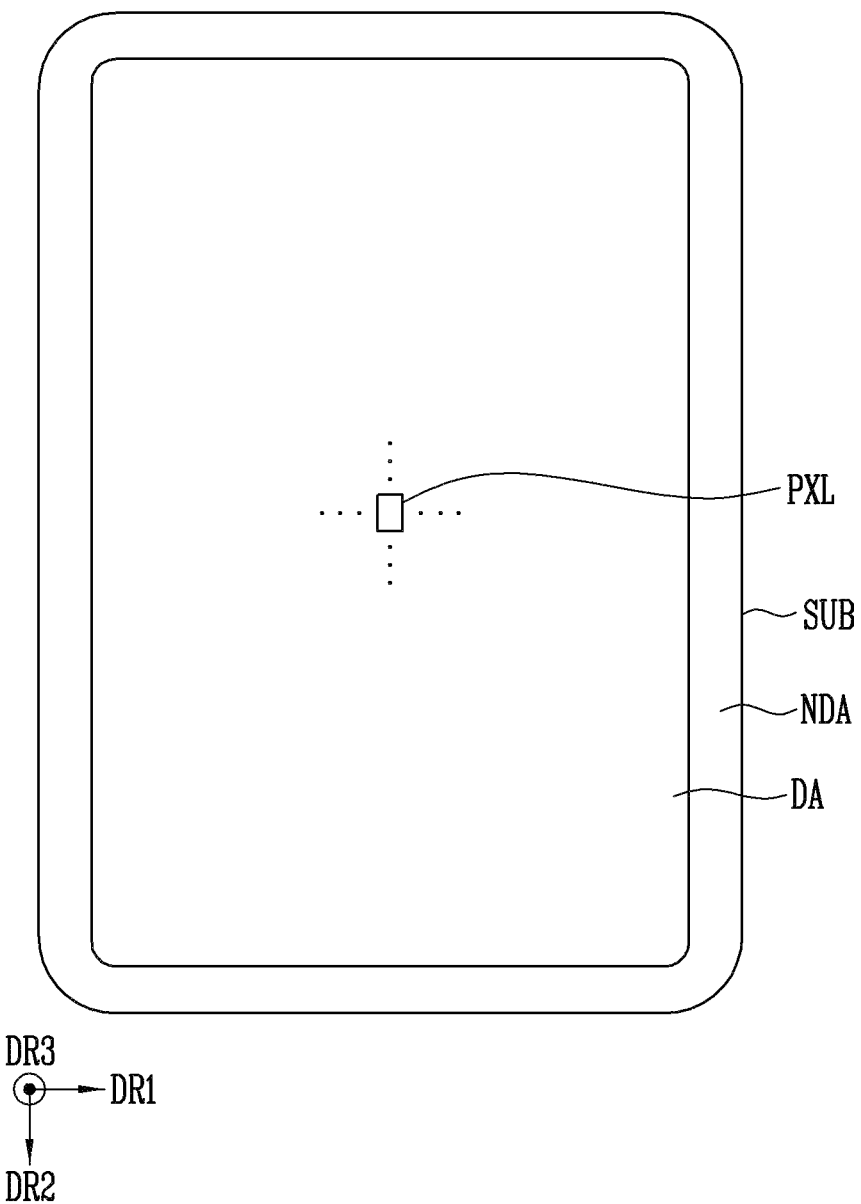
FIG. 3 is a schematic plan view illustrating a display device according to an embodiment of the disclosure, in particular, a display device using the light emitting element shown in FIGS. 1 and 2 as a light source.

FIG. 3 is a schematic plan view illustrating a display device according to an embodiment of the disclosure, in particular, a display device using the light emitting element shown in FIGS. 1 and 2 as a light source.

In FIG. 3, for convenience, a structure of the display device is briefly shown based on a display area DA where an image is displayed.

Referring to FIGS. 1A to 3, the display device according to an embodiment of the disclosure may include a substrate SUB, a plurality of pixels PXL provided on the substrate SUB and each including at least one light emitting element LD, the driver provided on the substrate SUB and driving the pixels PXL, a line portion connecting the pixels PXL and the driver to each other.

When the display device is an electronic device to which a display surface is applied to at least one surface, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, or wearable device, the disclosure may be applied to the display device.

The display device may be classified into a passive matrix type display device and an active matrix type display device according to a method of driving the light emitting element LD. For example, when the display device is implemented as an active matrix type, each of the pixels PXL may include a driving transistor that controls a current amount supplied to the light emitting element LD, a switching transistor that transfers a data signal to the driving transistor, and the like.

The display device may be provided in various shapes, and for example, may be provided in a rectangular plate shape having two pairs of sides parallel to each other, but the disclosure is not limited thereto. When the display device is provided in the rectangular plate shape, one pair of sides of the two pairs of sides may be provided to be longer than the other pair of sides. For convenience, the display device has a rectangular shape having a pair of long sides and a pair of short sides. An extension direction of a long side is denoted as a second direction DR2, an extension direction of a short side is denoted as a first direction DR1, and a direction perpendicular to the extension direction of the long side and the short side is denoted as a third direction DR3. The display device provided in the rectangular plate shape may have a round shape in a corner portion where one long side and one short side contact (or meet), but the disclosure is not limited thereto.

The substrate SUB may include a display area DA and a non-display area NDA.

The display area DA may be an area where the pixels PXL that displays an image are provided. The non-display area NDA may be an area where the driver for driving the pixels PXL and a portion of the line portion connecting the pixels PXL and the driver to each other are provided. For convenience, only one pixel PXL is shown in FIG. 3, but substantially a plurality of pixels PXL may be provided in the display area DA of the substrate SUB.

The non-display area NDA may be provided on at least one side of the display area DA. The non-display area NDA may surround a periphery (or an edge) of the display area DA. The non-display area NDA may be provided with the line portion connected to the pixels PXL, and the driver connected to the line portion and driving the pixels PXL.

The line portion may electrically connect the driver and the pixels PXL to each other. The line portion may provide a signal to each pixel PXL and may be signal lines connected to each pixel PXL, for example, fan-out lines connected to a scan line, a data line, a light emission control line, and the like. In addition, the line portion may be signal lines connected to each pixel PXL, for example, fan-out lines connected to a control line, a sensing line, and the like, in order to compensate for an electrical characteristic change of each pixel 20) PXL in real time.

The substrate SUB may include a transparent insulating material and may transmit light. The substrate SUB may be a rigid substrate or a flexible substrate.

One area on the substrate SUB may be provided as the display area DA and thus the pixels PXL may be disposed, and the remaining area on the substrate SUB may be provided as the non-display area NDA. For example, the substrate SUB may include the display area DA including pixel areas in which each pixel PXL is disposed, and the non-display area NDA disposed around the display area DA (or adjacent to the display area DA).

Each of the pixels PXL may be provided in the display area DA on the substrate SUB. In an embodiment of the disclosure, the pixels PXL may be arranged in the display area DA in a stripe arrangement structure or pentile arrangement structure, but the disclosure is not limited thereto.

Each of the pixels PXL may include at least one light emitting element LD driven by corresponding scan signal and data signal. The light emitting element LD may have a size as small as a micro scale or a nano scale and may be connected in parallel with adjacent light emitting elements, but the disclosure is not limited thereto. The light emitting element LD may configure a light source of each of the pixels PXL.

Each of the pixels PXL may include at least one light source driven by a predetermined signal (for example, a scan signal, a data signal, and the like) and/or predetermined power (for example, first driving power, second driving power, and the like), for example, the light emitting element LD shown in FIG. 1. However, the type of the light emitting element LD that may be used as the light source of each of the pixels PXL is not limited thereto.

The driver may provide a predetermined signal and predetermined power to each pixel PXL through the line portion, thereby controlling driving of the pixel PXL. The driver may include a scan driver, a light emission driver, a data driver, and a timing controller.

Figure 4:
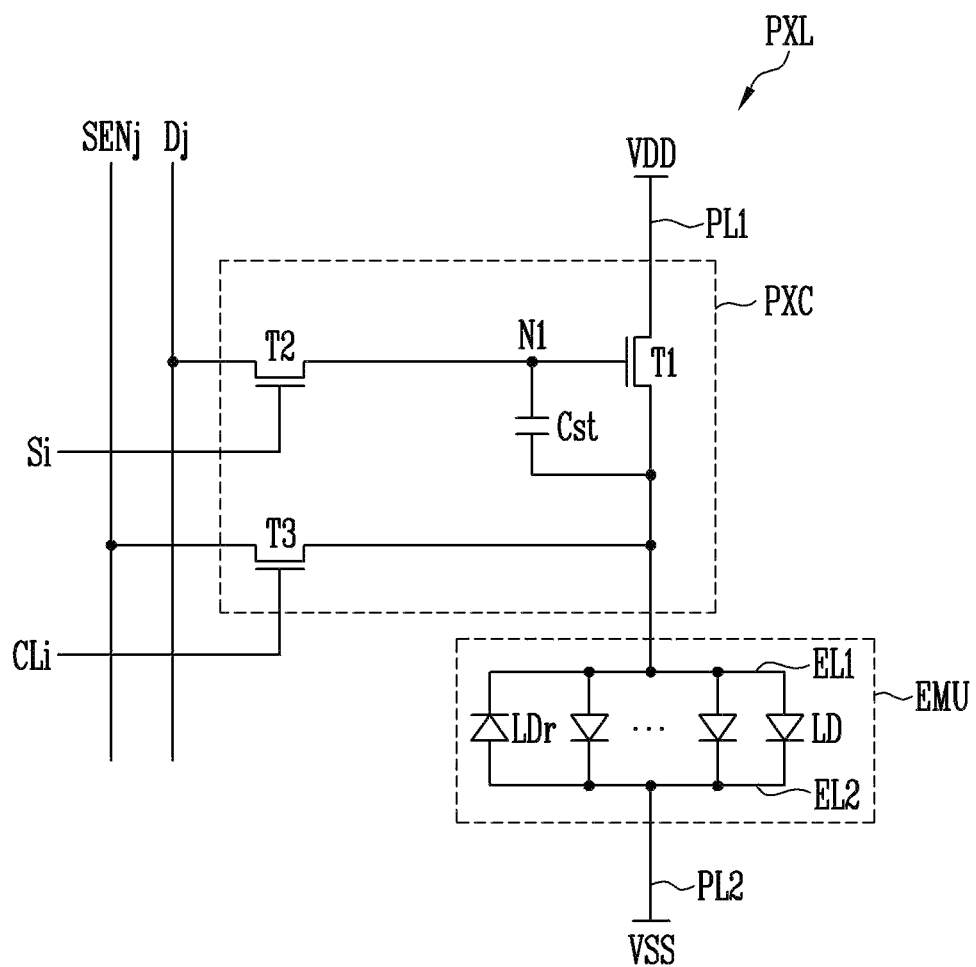
FIG. 4 is circuit diagram illustrating an electrical connection relationship between components included in one pixel shown in FIG. 3 according to an embodiment.

FIG. 4 is circuit diagram illustrating an electrical connection relationship between components included in one pixel shown in FIG. 3 according to an embodiment.

For example, FIG. 4 shows the electrical connection relationship between the components included in the pixel PXL that may be applied to the active display device according to an embodiment. However, types of the components included in the pixel PXL to which an embodiment of the disclosure may be applied are not limited thereto.

In FIG. 4, not only the components included in each of the pixels shown in FIG. 3 but also an area where the components are provided are referred to as the pixel PXL.

Referring to FIGS. 1 to 4, one pixel PXL (hereinafter referred to as a 'pixel') may include a light emitting unit EMU that generates light of a luminance corresponding to the data signal. In addition, the pixel PXL may selectively further include a pixel circuit PXC for driving the light emitting unit EMU.

According to an embodiment, the light emitting unit EMU may include a plurality of light emitting elements LD connected in parallel between a first power line PL1 to which a voltage of first driving power VDD is applied and a second power line PL2 to which a voltage of second driving power VSS is applied. For example, the light emitting unit EMU may include a first electrode EL1 (or a "first alignment electrode") connected to the first driving power VDD via the pixel circuit PXC and the first power line PL1, a second electrode EL2 (or a "second alignment electrode") connected to the second 10) driving power VSS via the second power line PL2, and the plurality of light emitting elements LD connected in parallel in the same direction between the first and second electrodes EL1 and EL2. In an embodiment of the disclosure, the first electrode EL1 may be an anode electrode, and the second electrode EL2 may be a cathode electrode.

Each of the light emitting elements LD included in the light emitting unit EMU may include the one end connected to the first driving power VDD through the first electrode EL1 and the other end connected to the second driving power VSS through the second electrode EL2. The first driving power VDD and the second driving power VSS may have different potentials. For example, the first driving power VDD may be set as high potential power, and the second driving power VSS may be set as low potential power. At this time, a potential difference between the first driving power VDD and the second driving power VSS may be set as a threshold voltage or more of the light emitting elements LD during a light emission period of the pixel PXL.

As described above, the respective light emitting elements LD connected in parallel in the same direction (for example, a forward direction) between the first electrode EL1 and the second electrode EL2 to which voltages of different potentials are respectively supplied may configure respective effective light sources. Such effective light sources may be gathered to configure the light emitting unit EMU of the pixel PXL.

The light emitting elements LD of the light emitting unit EMU may emit light at a luminance corresponding to a driving current supplied through the corresponding pixel circuit PXC. For example, the pixel circuit PXC may supply a driving current corresponding to a grayscale value of corresponding frame data to the light emitting unit EMU during each frame period. The driving current supplied to the light emitting unit EMU may be divided and flow to each of the light emitting elements LD. Therefore, each of the light emitting elements LD may emit light at a luminance corresponding to the current flowing through the light emitting element LD, and thus the light emitting unit EMU may emit light of the luminance corresponding to the driving current.

Meanwhile, an embodiment in which the both ends of the light emitting elements LD are connected in the same direction between the first driving power VDD and the second driving power VSS is shown, but the disclosure is not limited thereto. According to an embodiment, the light emitting unit EMU may further include at least one ineffective light source, for example, a reverse light emitting element LDr, in addition to the light emitting elements LD configuring each effective light source. The reverse light emitting element LDr may be connected in parallel between the first and second electrodes EL1 and EL2 together with the light emitting elements LD configuring the effective light sources, and may be connected between the first and second electrodes EL1 and EL2 in a direction opposite to the light emitting elements LD. The reverse light emitting element LDr maintains an inactive state even though a predetermined driving voltage (for example, a driving voltage of a forward direction) is applied between the first and second electrodes EL1 and EL2, and thus a current substantially does not flow through the reverse light emitting element LDr.

The pixel circuit PXC may be connected to a scan line Si and a data line Dj of a corresponding pixel PXL. For example, when the pixel PXL is disposed in an i-th (i is a natural number) row and a j-th 20) (j is a natural number)

column of the display area DA, the pixel circuit PXC of the pixel PXL may be connected to the i-th scan line Si and the j-th data line Dj of the display area DA. In addition, the pixel circuit PXC may be connected to an i-th control line CLi and a j-th sensing line SENj of the display area DA.

The pixel circuit PXC described above may include first to third transistors T1 to T3 and a storage capacitor Cst.

A first terminal of the second transistor T2 (switching transistor) may be connected to the j-th data line Dj, and a second terminal may be connected to a first node N1. Here, the first terminal and the second terminal of the second transistor T2 may be different terminals. For example, when the first terminal is a source electrode, the second terminal may be a drain electrode. In addition, a gate electrode of the second transistor T2 may be connected to the i-th scan line Si.

The second transistor T2 may be turned on when a scan signal of a voltage at which the second transistor T2 may be turned on is supplied from the scan line Si, to electrically connect the j-th data line Dj and the first node N1 to each other. At this time, a data signal of a corresponding frame is supplied to the j-th data line Dj, and thus the data signal is transferred to the first node N1. The data signal transferred to the first node N1 is charged in the storage capacitor Cst.

A first terminal of the first transistor T1 (driving transistor) may be connected to the first driving power VDD, and a second terminal may be electrically connected to the first electrode EL1 of each of the light emitting elements LD. A gate electrode of the first transistor T1 may be connected to the first node N1. The first transistor T1 may control an amount of the driving current supplied to the light emitting elements LD in correspondence with a voltage of the first node N1.

The third transistor T3 may be connected between the first transistor T1 and the j-th sensing line SENj. For example, a first terminal of the third transistor T3 may be connected to the first terminal (for example, the source electrode) of the first transistor T1 connected to the first electrode EL1, and the second terminal of the third transistor T3 may be connected to the j-th sensing line SENj. A gate electrode of the third transistor T3 may be connected to the i-th control line CLi. The third transistor T3 is turned on by a control signal of a gate-on voltage supplied to the i-th control line CLi during a predetermined sensing period, to electrically connect the j-th sensing line SENj and the first transistor T1 to each other.

The sensing period may be a period for extracting characteristic information (for example, a threshold voltage of the first transistor T1, and the like) of each of the pixels PXL disposed in the display area DA.

One electrode of the storage capacitor Cst may be connected to the first driving power VDD, and another electrode may be connected to the first node N1. The storage capacitor Cst may charge a voltage corresponding to the data signal supplied to the first node N1 and maintain the charged voltage until the data signal of a next frame is supplied.

Meanwhile, FIG. 4 discloses an embodiment in which all of the first to third transistors T1 to T3 are N-type transistors, but the disclosure is not limited thereto. For example, at least one of the above-described first to third transistors T1 to T3 may be changed to a P-type transistor. In addition, FIG. 4 discloses an embodiment in which the light emitting unit EMU is connected between the pixel circuit PXC and the second driving power VSS, but the light emitting unit EMU may be connected between the first driving power VDD and the pixel circuit PXC.

A structure of the pixel circuit PXC may be variously changed. For example, the pixel circuit PXC may further include at least one transistor element such as a transistor element for initializing the first node N1, and/or a transistor element for controlling a light emission time of the light emitting elements LD, and other circuit elements such as a boosting capacitor for boosting the voltage of the first node N1.

In addition, FIG. 4 shows an embodiment in which all of the light emitting elements LD configuring each light emitting unit EMU are connected in parallel, but the disclosure is not limited thereto. According to an embodiment, the light emitting unit EMU may be configured to include at least one series stage including a plurality of light emitting elements LD connected in parallel with each other. That is, the light emitting unit EMU may be configured in a serial/parallel mixed structure.

A structure of the pixel PXL that may be applied to the disclosure is not limited to the embodiment shown in FIG. 4, and the corresponding pixel PXL may have various structures. For example, each pixel PXL may be configured inside a passive light emitting display device or the like. In this case, the pixel circuit PXC may be omitted, and the both ends of the light emitting elements LD included in the light emitting unit EMU may be directly connected to the i-th scan line Si, the j-th data line Dj, the first power line PL1 to which the first driving power VDD is applied, the second power line PL2 to which the second driving power VSS is applied, a predetermined control line, and/or the like.

Figure 5:
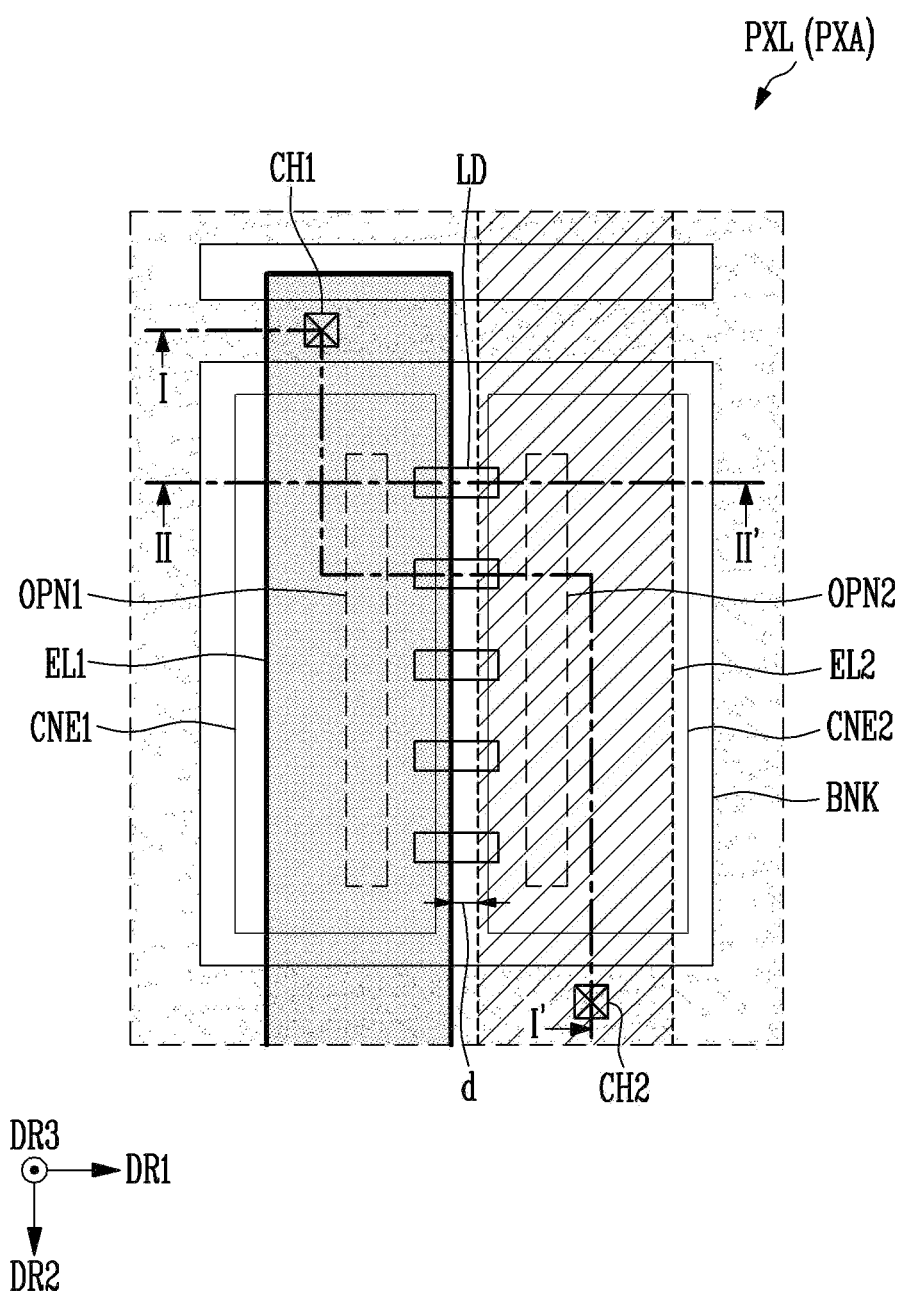
FIG. 5 is a plan view schematically showing one of pixels shown in FIG. 3.
Figure 6:
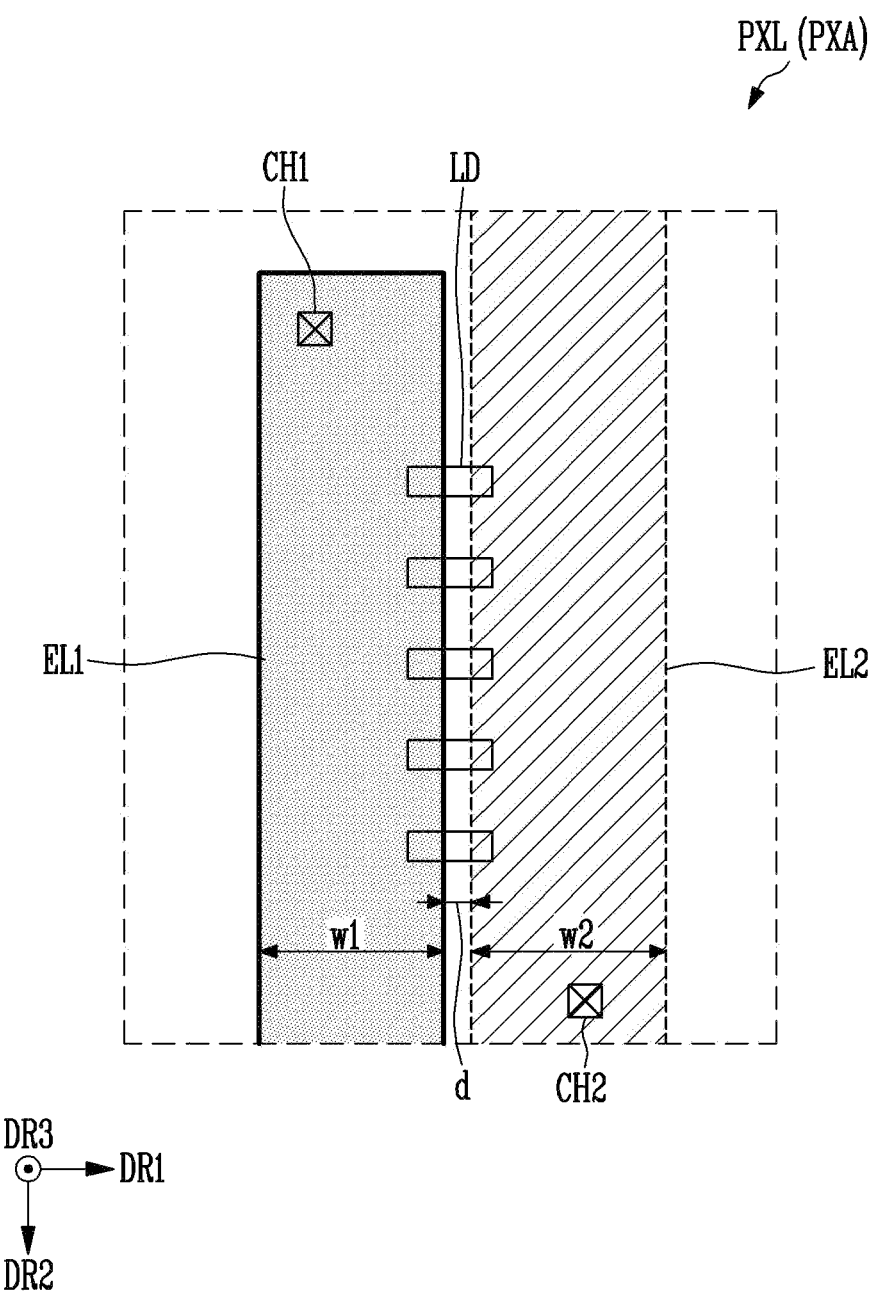
FIG. 6 is a schematic plan view showing only first and second electrodes and light emitting elements in the pixel of FIG. 5.
Figure 7:
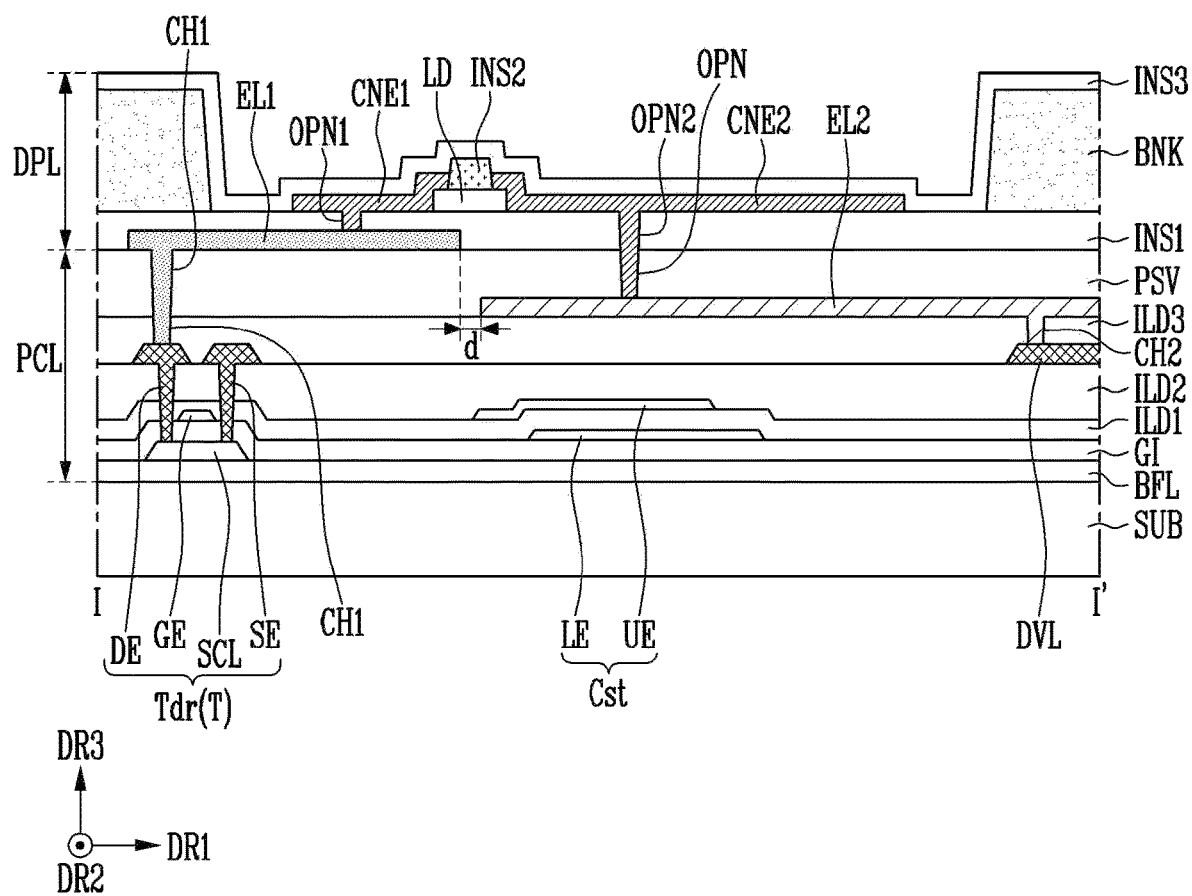
FIG. 7 is a cross-sectional view taken along a line I~I' of FIG. 5.
Figure 8:
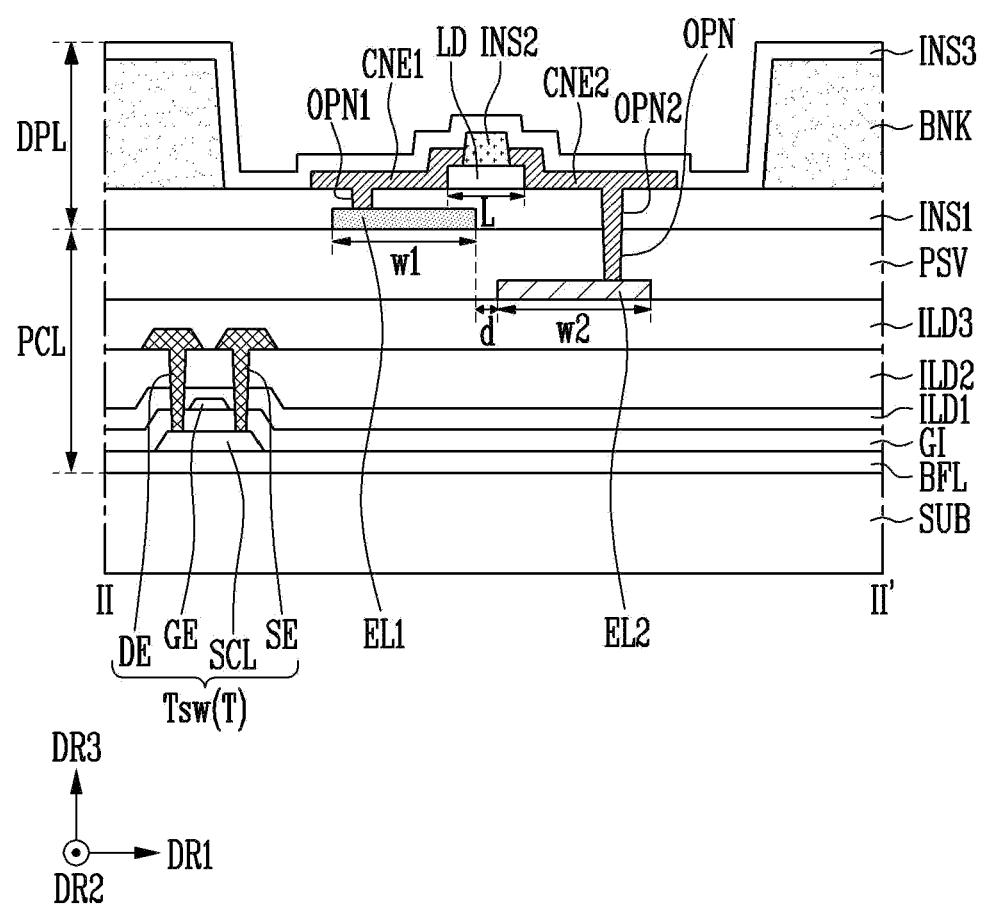
FIG. 8 is a cross-sectional view taken along a line II~II' of FIG. 5.
Figure 9:
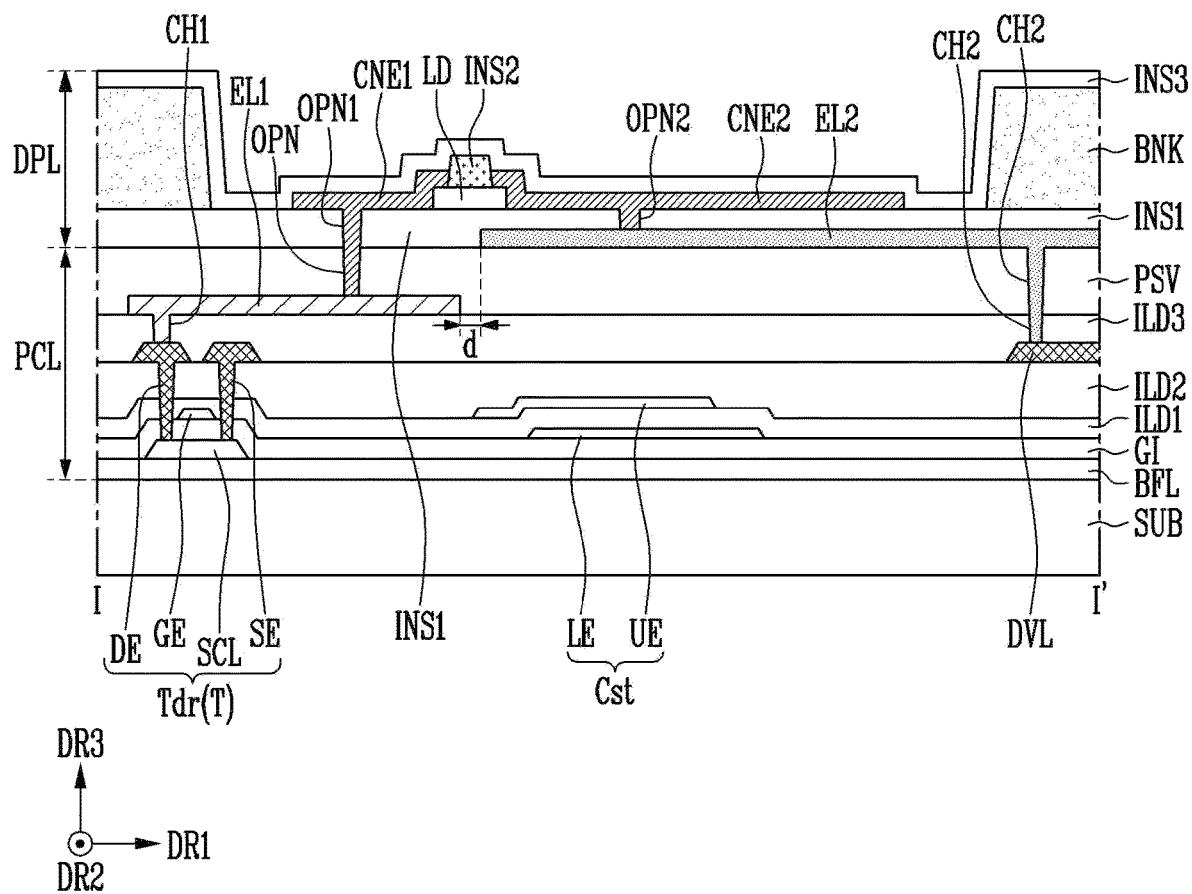
FIGS. 9 and 10 are implementations of the first and second electrodes of FIG. 7 according to another embodiment and are cross-sectional views corresponding to the line I~I' of FIG. 5.
Figure 10:
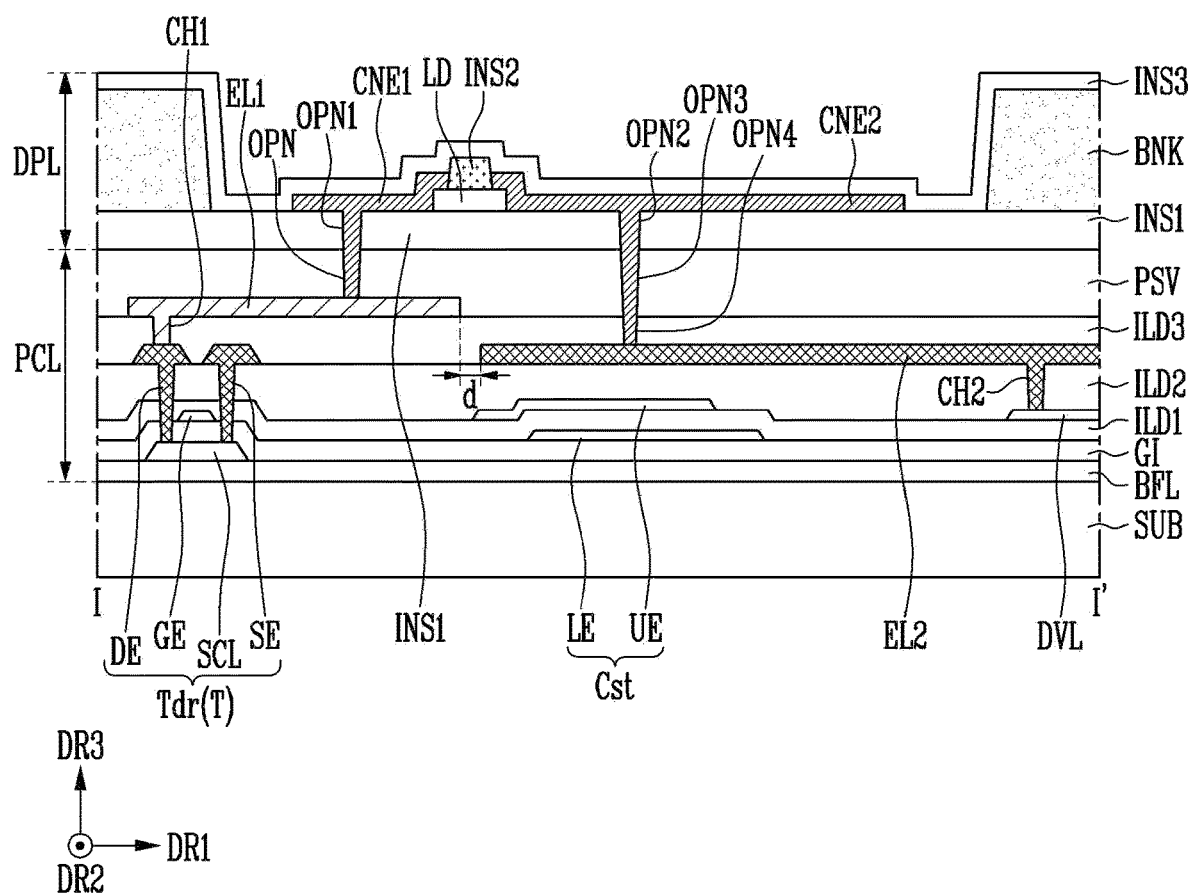
Figure 11:
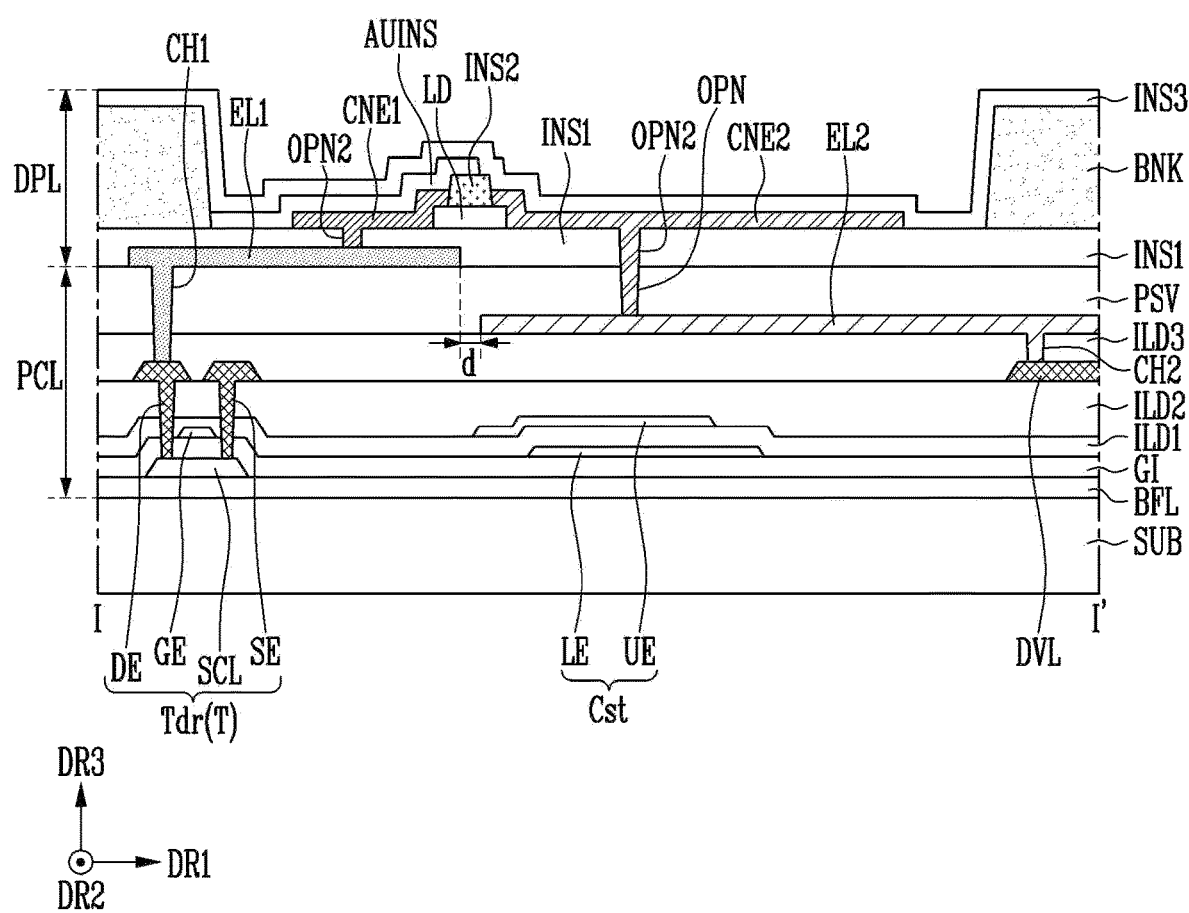
FIG. 11 is an implementation of the first and second electrodes of FIG. 7 according to another embodiment and is a cross-sectional view corresponding to the line I~I' of FIG. 5.

FIG. 5 is a plan view schematically showing one of the pixels shown in FIG. 3, FIG. 6 is a schematic plan view showing only the first and second electrodes and light emitting elements in the pixel of FIG. 5, FIG. 7 is a cross-sectional view taken along a line I~I' of FIG. 5, FIG. 8 is a cross-sectional view taken along a line II~II' of FIG. 5, FIGS. 9 and 10 are implementations of the first and second electrodes of FIG. 7 according to another embodiment and are cross-sectional views corresponding to the line I~I' of FIG. 5, and FIG. 11 is an implementation of the first and second electrodes of FIG. 7 according to another embodiment and is a cross-sectional view corresponding to the line I~I' of FIG. 5.

In FIG. 5, for convenience, transistors T electrically connected to the light emitting elements LD and signal lines connected to the transistors T are omitted.

In FIGS. 5 to 11, one pixel PXL is simplified and shown such as showing each electrode as an electrode of a single film and each insulating layer as an insulating layer of a single film, but the disclosure is not limited thereto.

Additionally, in an embodiment of the disclosure, "connection" between two components may mean that both electrical and physical connections are used.

In addition, in an embodiment of the disclosure, for convenience of description, a traverse direction (or a horizontal direction) on a plane is denoted as the first direction DR1, a longitudinal direction (or a vertical direction) on the plane is denoted as the second direction DR2, and a thickness direction of the substrate SUB on the cross section is denoted as the third direction DR3. The first to third directions DR1, DR2, and DR3 may refer to directions indicated by the first to third directions DR1, DR2, and DR3, respectively.

Referring to FIGS. 1 to 11, the display device according to an embodiment may include the plurality of pixels PXL provided on the substrate SUB.

The substrate SUB may include a transparent insulating material and may transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The material applied to the substrate SUB may preferably have resistance (or heat resistance) to a high process temperature in a manufacturing process of the display device.

The substrate SUB may include the display area DA including the pixel area PXA on which each pixel PXL is disposed, and the non-display area NDA disposed around (or adjacent to) the display area DA.

The pixels PXL may be arranged in a matrix form and/or a stripe form along a plurality of pixel rows extended in the first direction DR1 and a plurality of pixel columns extended in the second direction DR2 different from, for example, crossing the first direction DR1 in the display area DA on the substrate SUB, but the disclosure is not limited thereto. According to an embodiment, the pixels PXL may be provided in the display area DA on the substrate SUB in various arrangement forms.

The pixel area PXA in which each pixel PXL is provided (or arranged) may include a light emission area in which light is emitted and a peripheral area adjacent to the light emission area (or surrounding a periphery of the light emission area). Here, the peripheral area may include a non-light emission area in which light is not emitted.

The line portion electrically connected to the pixels PXL may be positioned on the substrate SUB. The line portion may include a plurality of signal lines transferring a predetermined signal (or a predetermined voltage) to each pixel PXL. The signal lines may include the i-th scan line Si transferring a scan signal to each pixel PXL, the j-th data line Dj transferring a data signal to each pixel PXL, and power lines PL1 and DVL transferring driving power to each pixel PXL. According to an embodiment, the line portion may further include a light emission control line transferring a light emission control signal to each pixel PXL. In addition, according to another embodiment, the line portion may further include a sensing line and a control line connected to each pixel PXL.

Each pixel PXL may include a pixel circuit layer PCL provided on the substrate SUB and including the pixel circuit PXC, and the display element layer DPL including the plurality of light emitting elements LD. The light emitting elements LD may be positioned in the pixel area PXA of each pixel PXL.

For convenience, the pixel circuit layer PCL is first described, and then the display element layer DPL is described.

The pixel circuit layer PCL may include a buffer layer BFL, the pixel circuit PXC, and a passivation layer PSV. In addition, the pixel circuit layer PCL may include the second electrode EL2.

The buffer layer BFL may prevent an impurity from being diffused into the transistors T included in the pixel circuit PXC. The buffer layer BFL may be an inorganic insulating film including an inorganic material. The buffer layer BFL may include at least one of metal oxides such as silicon nitride (SINx), silicon oxide (SiOx), silicon oxynitride (SiOxNy), and aluminum oxide (AlOx). The buffer layer BFL may be provided as a single film, but may also be provided as multiple films of at least two films. When the buffer layer BFL is provided as multiple films, each layer may be formed of the same material or may be formed of different materials. The buffer layer BFL may be omitted according to the material, a process condition, and the like of the substrate SUB.

The pixel circuit PXC may include at least one transistor T and the storage capacitor Cst. The transistor T may include a driving transistor Tdr controlling the driving current of the light emitting elements LD and a switching transistor Tsw connected to the driving transistor Tdr. However, the disclosure is not limited thereto, and the pixel circuit PXC may further include circuit elements performing other functions in addition to the driving transistor Tdr and the switching transistor Tsw. In the following embodiment, the driving transistor Tdr and the switching transistor Tsw are collectively referred to as a transistor T or transistors T. The driving transistor Tdr may have the same configuration as the first transistor T1 described with reference to FIG. 4, and the switching transistor Tsw may have the same configuration as the second transistor T2 described with reference to FIG. 4.

Each of the driving transistor Tdr and the switching transistor Tsw may include a transistor semiconductor pattern SCL, a gate electrode GE, a first terminal SE, and a second terminal DE. The first terminal SE may be any one of a source electrode and a drain electrode, and the second terminal DE may be the other electrode. For example, when the first terminal SE is the source electrode, the second terminal DE may be the drain electrode.

The semiconductor pattern SCL may be provided and/or formed on the buffer layer BFL. The semiconductor pattern SCL may include a first contact region that is in contact with the first terminal SE and a second contact region that is in contact with the second terminal DE. A region between the first contact region and the second contact region may be a channel region. The channel region may overlap a gate electrode GE of a corresponding transistor T. The semiconductor pattern SCL may be a semiconductor pattern formed of polysilicon, amorphous silicon, an oxide semiconductor, or the like. For example, the channel region may be a semiconductor pattern which is not doped with an impurity and may be an intrinsic semiconductor. The first contact region and the second contact region may be a semiconductor pattern doped with an impurity.

The gate electrode GE may be provided and/or formed on a gate insulating layer GI so as to correspond to the channel region of the semiconductor pattern SCL. The gate electrode GE may be provided on the gate insulating layer GI and overlap the channel region of the semiconductor pattern SCL. The gate electrode GE may be formed as a single film selected from copper (Cu), molybdenum (Mo), tungsten (W), aluminum neodymium (AlNd), titanium (Ti), aluminum (Al), silver (Ag) and an alloy thereof alone or a mixture thereof, or as two film or multiple film structure of molybdenum (Mo), titanium (Ti), copper (Cu), aluminum (Al), or silver (Ag) that is a low resistance material in order to reduce a line resistance.

The gate insulating layer GI may be an inorganic insulating film including an inorganic material. For example, the gate insulating layer GI may include at least one of metal oxides such as silicon nitride (SINx), silicon oxide (SiOx), silicon oxynitride (SiON), and AlOx. However, the material of the gate insulating layer GI is not limited to the above-described embodiments. According to an embodiment, the gate insulating layer GI may be formed of an organic insulating film including an organic material. The gate insulating layer GI may be provided as a single film, or may be provided as multiple films of at least two or more films.

The first terminal SE and the second terminal DE may be in contact with the first contact region and the second contact region of the semiconductor pattern SCL through contact holes sequentially passing through the gate insulating layer GI and first and second interlayer insulating layers ILD1 and ILD2, respectively. For example, the first terminal SE may be in contact with the first contact region of the semiconductor pattern SCL, and the second terminal DE may be in contact with the second contact region of the semiconductor pattern SCL. Each of the first and second terminals SE and DE may include the same material as the gate electrode GE, or may include one or more materials selected from materials exemplified as the configuration material of the gate electrode GE.

The first interlayer insulating layer ILD1 may include the same material as the gate insulating layer GI, or may include one or more materials selected from materials exemplified as the configuration materials of the gate insulating layer GI.

The second interlayer insulating layer ILD2 may be provided and/or formed on the first interlayer insulating layer ILD1. The second interlayer insulating layer ILD2 may be an inorganic insulating film including an inorganic material or an organic insulating film including an organic material. According to an embodiment, the second interlayer insulating layer ILD2 may include the same material as the first interlayer insulating layer ILD1, but the disclosure is not limited thereto. The second interlayer insulating layer ILD2 may be provided as a single film, but may also be provided as multiple films of at least two films.

In the above-described embodiment, the first and second terminals SE and DE of each of the driving transistor Tdr and the switching transistor Tsw are described as separate electrodes which are electrically connected to the semiconductor pattern SCL through the contact hole sequentially passing through the gate insulating layer GI and the first and second interlayer insulating layers ILD1 and ILD2, but the disclosure is not limited thereto. According to an embodiment, the first terminal SE of each of the driving transistor Tdr and the switching transistor Tsw may be the first contact region adjacent to the channel region of the corresponding semiconductor pattern SCL, and the second terminal DE of each of the driving transistor Tdr and the switching transistor Tsw may be the second contact region adjacent to the channel region of the corresponding semiconductor pattern SCL. In this case, the second terminal DE of the driving transistor Tdr may be electrically connected to the light emitting elements LD of a corresponding pixel PXL through a separate connection means such as a bridge electrode.

In an embodiment of the disclosure, the transistors T included in the pixel circuit PXC may be configured as a low temperature polycrystalline silicon thin film transistor (LTPS TFT), but the disclosure is not limited thereto. According to an embodiment, the transistors T included in the pixel circuit PXC may be configured of an oxide semiconductor thin film transistor. In addition, a case where the transistors T are thin film transistors of a top gate structure is described as an example, but the disclosure is not limited thereto. A structure of the transistors T may be variously changed.

The storage capacitor Cst may include a lower electrode LE provided on the gate insulating layer GI and an upper electrode UE provided on the first interlayer insulating layer ILD1 and overlapping the lower electrode LE.

The lower electrode LE may be provided on the same layer and may include the same material as the gate electrode GE of each of the driving transistor Tdr and the switching transistor Tsw. The lower electrode LE may be provided integrally with the gate electrode GE of the driving transistor Tdr. In this case, the lower electrode LE may be regarded as one region of the gate electrode GE of the driving transistor Tdr. According to an embodiment, the lower electrode LE may be provided in a separate configuration (or non-integrally) from the gate electrode GE of the driving transistor Tdr. In this case, the lower electrode LE and the gate electrode GE of the driving transistor Tdr may be electrically connected through a separate connection means.

The upper electrode UE may overlap the lower electrode LE and cover the lower electrode LE. A capacitance of the storage capacitor Cst may be increased by increasing an overlap region of the upper electrode UE and the lower electrode LE. The upper electrode UE may be electrically connected to the first power line PL1. The storage capacitor Cst may be covered by the second interlayer insulating layer ILD2.

The pixel circuit layer PCL may include a driving voltage line DVL provided and/or formed on the second interlayer insulating layer ILD2. The driving voltage line DVL may have the same configuration as the second power line PL2 described with reference to FIG. 4. The driving voltage line DVL may be connected to the second driving power VSS. Accordingly, a voltage of the second driving power VSS may be applied to the driving voltage line DVL. The pixel circuit layer PCL may further include the first power line PL1 connected to the first driving power VDD. Although not directly shown in the drawing, the first power line PL1 may be provided on the same layer as the driving voltage line DVL or may be provided on a layer different from the driving voltage line DVL.

Each of the first power line PL1 and the driving voltage line DVL may include a conductive material. For example, each of the first power line PL1 and the driving voltage line DVL may be formed as a single film selected from copper (Cu), molybdenum (Mo), tungsten (W), aluminum neodymium (AlNd), titanium (Ti), aluminum (Al), silver (Ag) and an alloy thereof alone or a mixture thereof, or as two film or multiple film structure of molybdenum (Mo), titanium (Ti), copper (Cu), aluminum (Al), or silver (Ag) that is a low resistance material in order to reduce a line resistance. For example, each of the first power line PL1 and the driving voltage line DVL may be formed of two films in which titanium (Ti)/copper (Cu) are sequentially stacked.

A third interlayer insulating layer ILD3 may be provided and/or formed on the transistors T and the driving voltage line DVL.

The third interlayer insulating layer ILD3 may include the same material as the first and second interlayer insulating layers ILD1 and ILD2, but the disclosure is not limited thereto. For example, the third interlayer insulating layer ILD3 may be an inorganic insulating film including an inorganic material. The third interlayer insulating layer ILD3 may include a first contact hole CH1 exposing the second terminal DE of the driving transistor Tdr and a second contact hole CH2 exposing one region of the driving voltage line DVL to the outside.

The second electrode EL2 may be provided and/or formed on the third interlayer insulating layer ILD3.

The second electrode EL2 may be configured of one of conductive layers included in the pixel circuit layer PCL. For example, when the pixel circuit layer PCL includes a first conductive layer provided on the gate insulating layer GI, a second conductive layer provided on the first interlayer insulating layer ILD1, a third conductive layer provided on the second interlayer insulating layer ILD2, and a fourth conductive layer provided on the third interlayer insulating layer ILD3, the second electrode EL2 may be the fourth conductive layer. In this case, the gate electrode GE of the transistors T may be the first conductive layer, the upper electrode UE of the storage capacitor Cst may be the second conductive layer, and the driving voltage line DVL may be the third conductive layer.

The second electrode EL2 may be electrically and/or physically connected to the driving voltage line DVL through the second contact hole CH2 passing through the third interlayer insulating layer ILD3. Accordingly, the second electrode EL2 may be connected to the driving voltage line DVL to which the voltage of the second driving power VSS is applied.

The second electrode EL2 may be configured of a conductive material having a constant reflectance. The conductive material may include an opaque metal that is advantageous for reflecting the light emitted from the light emitting elements LD in an image display direction (for example, a front direction) of the display device. For example, the second electrode EL2 may include the same material as the driving voltage line DVL or may include one or more materials selected from materials exemplified as the configuration material of the driving voltage line DVL.

In an embodiment of the disclosure, the second electrode EL2 may function as an alignment electrode for aligning the light emitting elements LD together with some components, for example, the first electrode EL1 included in the display element layer DPL. In addition, the second electrode EL2 may function as a driving electrode for driving the light emitting elements LD together with the first electrode EL1 after the alignment of the light emitting elements LD.

The passivation layer PSV may be provided and/or formed on the second electrode EL2.

The passivation layer PSV may be provided in a form including an organic insulating film, an inorganic insulating film, or the organic insulating film disposed on the inorganic insulating film. For example, the inorganic insulating film may include at least one of metal oxides such as silicon oxide (SiOx), silicon nitride (SiNx), silicon oxynitride (SiOxNy), and aluminum oxide (AlOx). For example, the organic insulating film may include at least one of an acrylic resin, an epoxy resin, a phenolic resin, a polyamide resin, a polyimide resin, an unsaturated polyester resin, a poly-phenylene ethers resin, a poly-phenylene sulfides resin, and a benzocyclobutene resin.

The passivation layer PSV may include a first contact hole CH1 corresponding to the first contact hole CH1 passing through the third interlayer insulating layer ILD3. In addition, the passivation layer PSV may include an opening OPN exposing one region of the second electrode EL2.

The display element layer DPL may be provided and/or formed on the passivation layer PSV.

The display element layer DPL may include a bank BNK, the first electrode EL1, the light emitting elements LD, first and second contact electrodes CNE1 and CNE2, and first to third insulating layers INS1 to INS3.

The bank BNK may be a structure that defines (or partitions) the pixel area PXA or the light emission area a corresponding pixel PXL and each of the pixels PXL adjacent to the corresponding pixel, and may be, for example, a pixel defining film. The bank BNK may be configured to include at least one light blocking material and/or a reflective material to prevent a light leakage defect in which light (or ray) is leaked between the corresponding pixel PXL and the pixels PXL adjacent thereto.

The first electrode EL1 may extend in one direction, for example, the second direction DR2. The first electrode EL1 may be electrically connected to some configurations, for example, the driving transistor Tdr, included in the pixel circuit layer PCL of the corresponding pixel PXL through the first contact hole CH1 sequentially passing through the passivation layer PSV and the third interlayer insulating layer ILD3.

The first electrode EL1 may be configured of a material having a constant reflectance in order to cause the light emitted from each of the light emitting elements LD to progress in the image display direction of the display device. The first electrode EL1 may be configured of a conductive material having a constant reflectance. The conductive material may include an opaque metal that is advantageous for reflecting the light emitted from the light emitting elements LD in the image display direction of the display device. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. According to an embodiment, the first electrode EL1 may include a transparent conductive material. The transparent conductive material may include conductive oxide such as indium tin oxide (ITO), indium zinc oxide (IZO), zinc oxide (ZnO), indium gallium zinc oxide (IGZO), and indium tin zinc oxide (ITZO), conductive polymer such as poly(3,4-ethylenedioxythiophene) (PEDOT), and the like. When the first electrode EL1 includes the transparent conductive material, a separate conductive layer formed of an opaque metal for reflecting the light emitted from the light emitting elements LD in the image display direction of the display device may be added. However, the material of the first electrode EL1 is not limited to the above-described materials.

The first electrode EL1 may include the same material as the second electrode EL2 configured of the fourth conductive layer of the pixel circuit layer PCL. Each of the first electrode EL1 of the display element layer DPL and the second electrode EL2 of the pixel circuit layer PCL may be provided and/or formed as a single film, but the disclosure is not limited thereto. According to an embodiment, each of the first and second electrodes EL1 and EL2 may be provided and/or formed as multiple films in which at least two or more materials of metals, alloys, conductive oxides, and conductive polymers are stacked. Each of the first and second electrodes EL1 and EL2 may be formed of multiple films of at least two or more films to minimize distortion caused by signal delay when transferring a signal (or voltage) to the both ends of each of the light emitting elements LD. For example, each of the first and second electrodes EL1 and EL2 may be formed of multiple films in which indium tin oxide (ITO)/silver (Ag)/indium tin oxide (ITO) are sequentially stacked.

The first electrode EL1 and the second electrode EL2 may be disposed to be spaced apart from each other with the passivation layer PSV therebetween on a cross-sectional view. In addition, the first electrode EL1 and the second electrode EL2 may be disposed to be spaced apart from each other at a predetermined interval d or (a distance) in the first direction DR1 on a plan view. A width w1 of the first direction DR1 of the first electrode EL1 and a width w2 of the first direction DR1 of the second electrode EL2 may be the same on the plan view and the cross-sectional view, the disclosure is not limited thereto. According to an embodiment, the width w2 of the first direction DR1 of the second electrode EL2 may be greater than the width w1 of the first direction DR1 of the first electrode EL1.

As described above, the first electrode EL1 may be connected to some configurations of the pixel circuit layer PCL through the first contact hole CH1, and the second electrode EL2 may be connected to some configurations of the pixel circuit layer PCL through the second contact hole CH2.

Each of the first electrode EL1 and the second electrode EL2 may function as an alignment electrode (or an alignment line) for alignment of the light emitting elements LD by receiving a predetermined alignment signal (or alignment voltage) from a corresponding partial configuration of the pixel circuit layer PCL. For example, the first electrode EL1 may receive a first alignment signal (or a first alignment voltage) from some configurations of the pixel circuit layer PCL and function as a first alignment electrode (or first alignment line), and the second electrode EL2 may receive a second alignment signal (or a second alignment voltage) from other configurations of the pixel circuit layer PCL and function as a second alignment electrode (or second alignment line). Here, the first and second alignment signals (or alignment voltages) may be signals having a voltage difference and/or a phase difference of a degree at which the light emitting elements LD may be aligned between the first and second electrodes EL1 and EL2. At least one alignment signal (or alignment voltage) of the first and second alignment signals (or alignment voltages) may be an AC signal (or voltage), but the disclosure is not limited thereto.

After the light emitting elements LD are aligned in the pixel area PXA of each pixel PXL, in order to individually (or independently) drive each pixel PXL, a portion of the first electrode EL1, which is positioned between pixels PXL adjacent in one direction, for example, in the first direction DR1 and/or the second direction DR2, may be removed.

After the light emitting elements LD are aligned in the pixel area PXA, the first electrode EL1 and the second electrode EL2 may function as driving electrodes for driving the light emitting elements LD. The first electrode EL1 may be an anode electrode, and the second electrode EL2 may be a cathode electrode.

Each of the light emitting elements LD may be a micro light emitting diode of, for example, a size as small as nano scale to micro scale, using an inorganic crystal structure material. Each of the light emitting elements LD may be a micro light emitting diode manufactured by an etching method or a micro light emitting diode manufactured by a growth method.

At least two to tens of light emitting elements LD may be aligned and/or provided in the pixel area PXA of each pixel PXL, but the number of light emitting elements LD is not limited thereto. According to an embodiment, the number of light emitting elements LD aligned and/or provided in the pixel area PXA may be variously changed.

Each of the light emitting elements LD may emit any one of color light and/or white light. Each of the light emitting elements LD may be aligned on the first insulating layer INS1 between the first electrode EL1 and the second electrode EL2 such that a direction of the length L is parallel to the first direction DR1 on the plan view or the cross-sectional view. The light emitting elements LD may be provided in a form sprayed in a solution to be input to the pixel area PXA of each pixel PXL.

The light emitting elements LD may be input to the pixel area PXA of each pixel PXL through an inkjet printing method, a slit coating method, or other various methods. For example, the light emitting elements LD may be mixed with a volatile solvent and supplied to the pixel area PXA through an inkjet printing method or a slit coating method. At this time, when an alignment signal corresponding to each of the first and second electrodes EL1 and EL2 provided in the pixel area PXA is applied, an electric field may be formed between the first and second electrodes EL1 and EL2. Therefore, the light emitting elements LD may be aligned between the first electrode EL1 and the second electrode EL2.

After the light emitting elements LD are aligned, the light emitting elements LD may be finally aligned and/or provided in the pixel area PXA of each pixel PXL by volatilizing the solvent or removing the solvent in other methods.

The light emitting elements LD may overlap the first and second electrodes EL1 and EL2 on the plan view and the cross-sectional view. For example, on the plan view and the cross-sectional view, one end of each of the light emitting elements LD may overlap the first electrode EL1, and the other end of each of the light emitting elements LD may overlap the second electrode EL2. On the plan view, the light emitting elements LD may overlap each of the first and second electrodes EL1 and EL2, and the light emitting elements LD may be arranged on the first insulating layer INS1 so as to overlap a spaced apart region between the first electrode EL1 and the second electrode EL2.

The first insulating layer INS1 may include an inorganic insulating film formed of an inorganic material or an organic insulating film formed of an organic material. The first insulating layer INS1 may be formed of an inorganic insulating film that is advantageous for protecting the light emitting elements LD from the pixel circuit layer PCL of each pixel PXL. For example, the first insulating layer INS1 may include at least one of metal oxides such as silicon nitride (SiNx), silicon oxide (SiOx), silicon oxynitride (SiOxNy), and aluminum oxide (AlOx), but the disclosure is not limited thereto. According to an embodiment, the first insulating layer INS1 may be formed of an organic insulating film that is advantageous for planarizing a support surface of the light emitting elements LD.

The first insulating layer INS1 may include a first opening OPN1 exposing one region of the first electrode EL1 and a second opening OPN2 exposing one region of the second electrode EL2. The second opening OPN2 may correspond to the opening OPN of the passivation layer PSV. The first electrode EL1 may be in direct contact with the first contact electrode CNE1 by the first opening OPN1 and connected to the first contact electrode CNE1, and the second electrode EL2 may be in direct contact with the second contact electrode CNE1 through the second opening OPN2 of the first insulating layer INS1 and the opening OPN of the passivation layer PSV and connected to the second contact electrode CNE2. The first insulating layer INS1 may cover the remaining regions except for one region of each of the first and second electrodes EL1 and EL2.

The second insulating layers INS2 may be provided and/or formed on each of the light emitting elements LD. The second insulating layer INS2 may be provided and/or formed on the light emitting elements LD to partially cover the outer circumferential surface (or surface) of each of the light emitting elements LD to expose the both ends of each of the light emitting elements LD to the outside. The second insulating layer INS2 may be formed as an independent insulating pattern in the pixel area PXA of each pixel PXL, but the disclosure is not limited thereto.

The second insulating layer INS2 may be configured of a single film or multiple films, and may include an inorganic insulating film including at least one inorganic material or an organic insulating film including at least one organic material. The second insulating layer INS2 may include an inorganic insulating film that is advantageous for protecting each active layer 12 of the light emitting elements LD from external oxygen and moisture, and the like. However, the disclosure is not limited thereto. The second insulating layer INS2 may be configured of an organic insulating film including an organic material according to a design condition or the like of the display device to which the light emitting elements LD are applied. By forming the second insulating layer INS2 on the light emitting elements LD after the alignment of the light emitting elements LD is completed in each pixel area PXA of the pixels PXL, the light emitting elements LD may be prevented from deviating from an aligned position.

The active layer 12 of each of the light emitting elements LD may not be in contact with an external conductive material by forming the second insulating layer INS2 on the light emitting elements LD. The second insulating layer INS2 may cover only a portion of the outer circumferential surface (or surface) of each of the light emitting elements LD to expose the both ends of each of the light emitting elements LD to the outside.

The first contact electrode CNE1 may be provided on the first electrode EL1 to be connected to the first electrode EL1 by the first opening OPN1 of the first insulating layer INS1. According to an embodiment, when a capping layer (not shown) is disposed on the first electrode EL1, the first contact electrode CNE1 may be disposed on the capping layer and may be connected to the first electrode EL1 through the capping layer. The above-described capping layer may protect the first electrode EL1 from a defect or the like generated during a manufacturing process of the display device, and may further reinforce adhesion between the first electrode EL1 and the pixel circuit layer PCL positioned under the first electrode EL1. The capping layer may include a transparent conductive material (or material) such as indium zinc oxide (IZO).

In addition, the first contact electrode CNE1 may be provided and/or formed on the one end of each of the light emitting elements LD to be connected to the one end of each of the light emitting elements LD. Accordingly, the first electrode EL1 and the one end of each of the light emitting elements LD may be electrically connected to each other through the first contact electrode CNE1.

The second contact electrode CNE2 may be provided on the second electrode EL2 and may be connected to the second electrode EL2 by the second opening OPN2 of the first insulating layer INS1 and the opening OPN of the passivation layer PSV. According to an embodiment, when a capping layer is disposed on the second electrode EL2, the second contact electrode CNE2 may be disposed on the capping layer and connected to the second electrode EL2 through the capping layer.

In addition, the second contact electrode CNE2 may be provided and/or formed on the other end of each of the light emitting elements LD and may be connected to the other end of each of the light emitting elements LD. Accordingly, the second electrode EL2 and the other end of each of the light emitting elements LD may be electrically connected to each other through the second contact electrode CNE2.

The first and second contact electrodes CNE1 and CNE2 may be configured of various transparent conductive materials in order to cause the light emitted from each of the light emitting elements LD and reflected by the first and second electrodes EL1 and EL2 to progress in the image display direction of the display device without loss. For example, the first and second contact electrodes CNE1 and CNE2 may include at least one of various transparent conductive materials (or materials) including indium tin oxide (ITO), indium zinc oxide (IZO), zinc oxide (ZnO), indium gallium zinc oxide (IGZO), indium tin zinc oxide (ITZO), and the like, and may be configured to be substantially transparent or translucent to satisfy a predetermined transmittance (or transmittance). However, the material of the first and second contact electrodes CNE1 and CNE2 is not limited to the above-described embodiment. According to an embodiment, the first and second contact electrodes CNE1 and CNE2 may be configured of various opaque conductive materials (or materials). The first and second contact electrodes CNE1 and CNE2 may be formed of a single film or multiple films.

On the plan view, each of the first and second contact electrodes CNE1 and CNE2 may have a bar shape extending along the second direction DR2, but the disclosure is not limited thereto. According to an embodiment, the shape of the first and second contact electrodes CNE1 and CNE2 may be variously changed within a range in which the first and second contact electrodes CNE1 and CNE2 are electrically connected to each of the light emitting elements LD stably. In addition, the shape of the first and second contact electrodes CNE1 and CNE2 may be variously changed in consideration of a connection relationship with electrodes disposed under the first and second contact electrodes CNE1 and CNE2.

The first and second contact electrodes CNE1 and CNE2 may be disposed to be spaced apart from each other in the first direction DR1. For example, the first contact electrode CNE1 and the second contact electrode CNE2 may be disposed to be spaced apart at a predetermined interval on the second insulating layer INS2 on the light emitting elements LD. The first contact electrode CNE1 and the second contact electrode CNE2 may be provided on the same layer and formed through the same process. However, the disclosure is not limited thereto, and according to an embodiment, the first and second contact electrodes CNE1 and CNE2 may be provided on different layers and formed through different processes. In this case, as shown in FIG. 11, an auxiliary insulating layer AUINS may be provided and/or formed between the first contact electrode CNE1 and the second contact electrode CNE2. The auxiliary insulating layer AUINS may include the same material as the first insulating layer INS1, or may include one or more materials selected from materials exemplified as the configuration material of the first insulating layer INS1. For example, the auxiliary insulating layer AUINS may be an inorganic insulating film including an inorganic material.

A third insulating layer INS3 may be provided and/or formed on the first and second contact electrodes CNE1 and CNE2. The third insulating layer INS3 may be an inorganic insulating film including an inorganic material or an organic insulating film including an organic material. For example, the third insulating layer INS3 may have a structure in which at least one inorganic insulating film or at least one organic insulating film is alternately stacked. The third insulating layer INS3 may entirely cover the display element layer DPL to block input of water, moisture, or the like to the display element layer DPL including the light emitting elements LD.

According to an embodiment, the display element layer DPL may be configured to selectively further include an optical layer in addition to the third insulating layer INS3. Here, the optical layer may include a color conversion layer including color conversion particles that convert the light emitted from the light emitting elements LD into light of a specific color.

As described above, the first electrode EL1 and the second electrode EL2 may be provided on different layers and disposed to be spaced apart from each other with one insulating layer included in the pixel circuit layer PCL, for example, the passivation layer PSV interposed therebetween. For example, the first electrode EL1 may be provided on the second electrode EL2 with the passivation layer PSV interposed therebetween. At this time, the first electrode EL1 and the second electrode EL2 may not overlap. When the first electrode EL1 and the second electrode EL2 are separated and disposed on different layers, a short defect between the first electrode EL1 and the second electrode EL2, which may occur due to a spatial limitation at a manufacturing step or the like of each pixel PXL, for example, a critical dimension (CD, 'a line width of each of electrodes or a width of a gap between the electrodes') limitation of the electrodes included in each pixel PXL, may be minimized.

The interval d (or the distance) between the first electrode EL1 and the second electrode EL2 may be equal to or less than the length L of each of the light emitting elements LD. However, the disclosure is not limited thereto, and the interval d (or the distance) between the first electrode EL1 and the second electrode EL2 may be greater than the length L of each of the light emitting elements LD. The interval d (or the distance) between the first electrode EL1 and the second electrode EL2 may be less than 4 µm. For example, the interval d (or the distance) between the first electrode EL1 and the second electrode EL2 may be about 2.5 µm, but the disclosure is not limited thereto.

As described above, when the first electrode EL1 and the second electrode EL2 are separated and disposed on different layers, the interval d (or the distance) between the first electrode EL1 and the second electrode EL2, which is designed in consideration of a process margin or the like such as the critical dimension (CD, 'the line width of each of the electrodes or the width of the gap between the electrodes') limitation, may be further reduced, in comparison with the pixel of another embodiment in which the first electrode EL1 and the second electrode EL2 are formed on the same layer. Accordingly, a limitation of a minimum interval d (or a distance) between the first electrode EL1 and the second electrode EL2 may be reduced, and thus a display device of high resolution and fine pitch may be easily implemented.

In addition, when the interval d (or the distance) between the first electrode EL1 and the second electrode EL2 is reduced, a larger (or stronger) electric field may be formed between the first electrode EL1 and the second electrode EL2. Accordingly, the number of unaligned light emitting elements LD may be reduced by more efficiently aligning the light emitting elements LD between the first electrode EL1 and the second electrode EL2. Therefore, loss of the light emitting elements LD may be minimized and the number of effective light emitting elements LD provided per unit area of each pixel PXL may be increased.

In the above-described embodiment, an embodiment in which the first electrode EL1 is provided to (or included in) the display element layer DPL and the second electrode EL2 is provided to (or included in) the pixel circuit layer PCL is described, but the disclosure is not limited thereto. According to an embodiment, the first electrode EL1 may be provided to (or included in) the pixel circuit layer PCL and the second electrode EL2 may be provided to (or included in) the display element layer DPL. As an example, as shown in FIG. 9, the first electrode EL1 may be provided on the third interlayer insulating layer ILD3 and the second electrode EL2 may be provided on the passivation layer PSV. In this case, the first electrode EL1 may be electrically connected to the driving transistor Tdr through the first contact hole CH1 passing through the third interlayer insulating layer ILD3, and the second electrode EL2 may be electrically connected to the driving voltage line DVL through the second contact hole CH2 sequentially passing through the third interlayer insulating layer ILD3 and the passivation layer PSV.

When the first electrode EL1 is provided to the pixel circuit layer PCL, the first contact electrode CNE1 may be electrically connected to the first electrode EL1 through the first opening OPN1 of the first insulating layer INS1 and the opening OPN of the passivation layer PSV. When the second electrode EL2 is provided on the display element layer DPL, the second contact electrode CNE2 may be electrically connected to the second electrode EL2 through the second opening OPN2 of the first insulating layer INS1.

In the above-described embodiments, an embodiment in which one electrode of the first and second electrodes EL1 and EL2 is provided to the display element layer DPL and the other electrode is provided to the pixel circuit layer PCL is described, but the disclosure is not limited thereto. According to an embodiment, the first and second electrodes EL1 and EL2 may be provided to the pixel circuit layer PCL. In this case, the first and second electrodes EL1 and EL2 may be configured of two conductive layers provided on two different layers with at least one insulating layer interposed therebetween among the first to fourth conductive layers included in the pixel circuit layer PCL. For example, as shown in FIG. 10, the first electrode EL1 may be configured of the fourth conductive layer provided on the third interlayer insulating layer ILD3, and the second electrode EL2 may be configured of the third conductive layer provided on the second interlayer insulating layer ILD2. At this time, the driving voltage line DVL may be configured of the second conductive layer provided on the first interlayer insulating layer ILD1. In this case, the first electrode EL1 may be electrically connected to the driving transistor Tdr through the first contact hole CH1 passing through the third interlayer insulating layer ILD3, and the second electrode EL2 may be electrically connected to the driving voltage line DVL through the second contact hole CH2 passing through the second interlayer insulating layer ILD2. In the above-described embodiment, a case where the driving voltage line DVL is configured of the second conductive layer is described, but the disclosure is not limited thereto. According to an embodiment, the driving voltage line DVL may be configured of the third conductive layer and integrally provided with the second electrode EL2.

When the first electrode EL1 is configured of the fourth conductive layer of the pixel circuit layer PCL, the first contact electrode CNE1 may be electrically connected to the first electrode EL1 through the first opening OPN1 of the first insulating layer INS1 and the opening OPN of the passivation layer PSV. When the second electrode EL2 is configured of the third conductive layer of the pixel circuit layer PCL, the second contact electrode CNE2 may be electrically connected to the second electrode EL2 through the second opening OPN2 of the first insulating layer INS1, the third opening OPN3 of the passivation layer PSV, and the fourth opening OPN4 of the third interlayer insulating layer ILD3. Here, the fourth opening OPN4 of the third interlayer insulating layer ILD3 and the third opening OPN3 of the passivation layer PSV may correspond to the second opening OPN2 of the first insulating layer INS1. In addition, the fourth opening OPN4 of the third interlayer insulating layer ILD3, the third opening OPN3 of the passivation layer PSV, and the second opening OPN2 of the first insulating layer INS1 may be formed through the same process, but the disclosure is not limited thereto, and the fourth opening OPN4 of the third interlayer insulating layer ILD3, the third opening OPN3 of the passivation layer PSV, and the second opening OPN2 of the first insulating layer INS1 may be formed through different processes.

When the pixel circuit layer PCL includes a bottom metal layer (not shown) between the substrate SUB and the buffer layer BFL, one of the first and second electrodes EL1 and EL2 may be provided on the same layer as the bottom metal layer, and the remaining electrode may be positioned on the one electrode with the buffer layer BFL interposed therebetween.

In the above-described embodiments, embodiments in which the first electrode EL1 and the second electrode EL2 are provided on different layers and are disposed to be spaced apart from each other at the predetermined interval d (or distance) on the plan view are described, but the disclosure is not limited thereto. According to an embodiment, the first electrode EL1 and the second electrode EL2 may be provided on different layers and at least one region may overlap on the plan view and the cross-sectional view. This is described later with reference to FIGS. 12 to 15.

Figure 12:
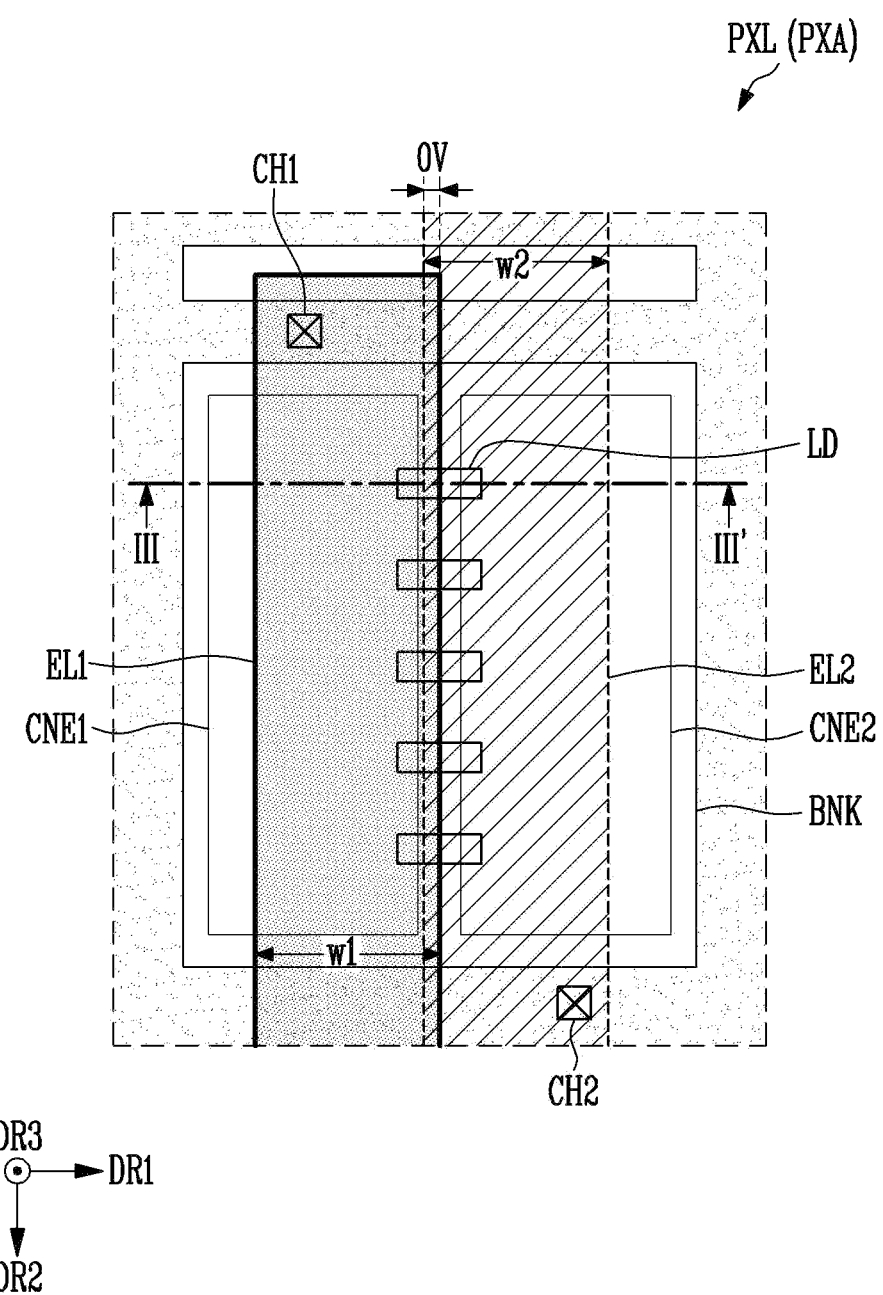
FIG. 12 is a plan view schematically illustrating a pixel according to another embodiment of the disclosure.
Figure 13:
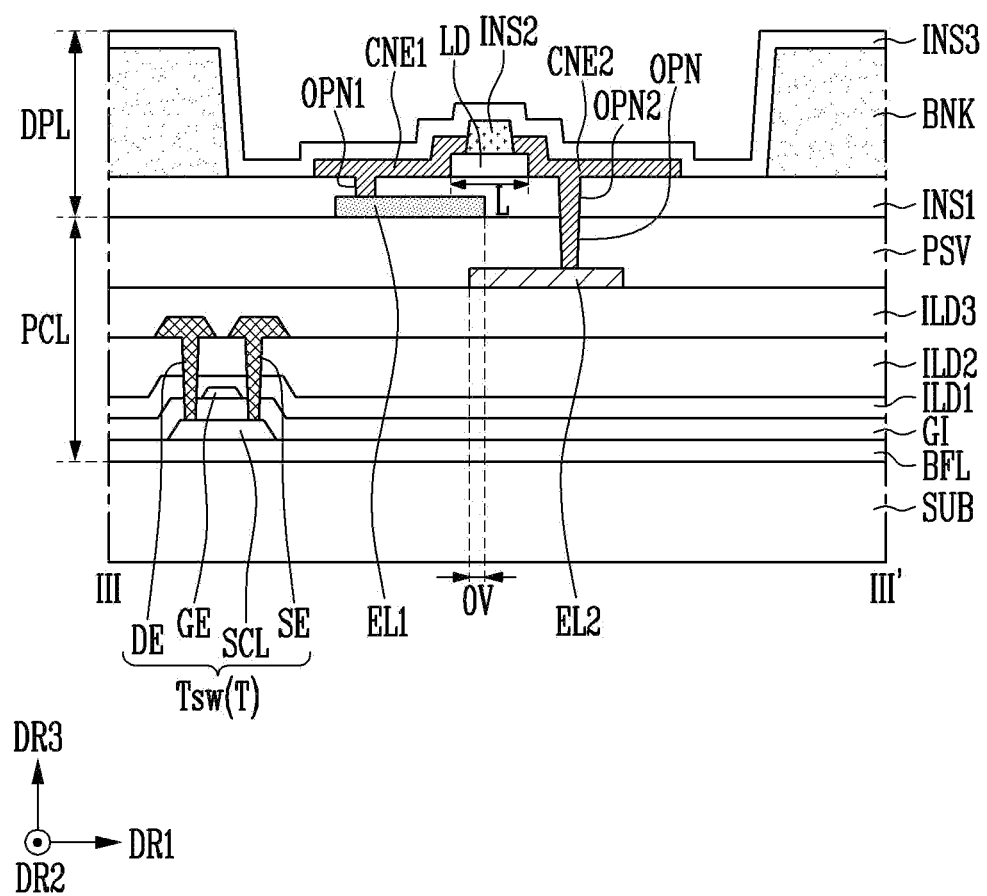
FIG. 13 is a cross-sectional view taken along a line III~III' of FIG. 12.

FIG. 12 is a plan view schematically illustrating a pixel according to another embodiment of the disclosure, and FIG. 13 is a cross-sectional view taken along a line III~III' of FIG. 12.

The pixel shown in FIGS. 12 and 13 may have a configuration substantially identical or similar to that of the pixel of FIGS. 5 to 8 except that the first electrode EL1 and the second electrode EL2 partially overlap.

Therefore, regarding the pixel of FIGS. 12 and 13, a point different from the above-described embodiment is mainly described in order to avoid repetitive description.

Referring to FIGS. 1 to 4, 12 and 13, the substrate SUB, the pixel circuit layer PCL, and the display element layer DPL may be disposed in the pixel area PXA of each pixel PXL.

The pixel circuit layer PCL may include at least one insulating layer, at least one transistor T, and the second electrode EL2. The at least one insulating layer may include the buffer layer BFL, the gate insulating layer GI, the first to third interlayer insulating layers ILD1 to ILD3, and the passivation layer PSV. The second electrode EL2 may be provided on the third interlayer insulating layer ILD3.

The display element layer DPL may include the bank BNK, the first electrode EL1, the light emitting elements LD, the first and second contact electrodes CNE1 and CNE2, and the first to third insulating layers INS1 to INS3.

The second electrode EL2 of the pixel circuit layer PCL and the first electrode EL1 of the display element layer DPL may overlap on the plan view. For example, the first electrode EL1 and the second electrode EL2 may include a region OV where the first electrode EL1 and the second electrode EL2 overlap (hereinafter referred to as an "overlap region") on the plan view.

The overlap region OV may correspond to a region in which the light emitting elements LD are positioned. For example, the overlap region OV may correspond to one region of the light emitting elements LD on the plan view. A width of the first direction DR1 of the overlap region OV may be less or greater than the length L of each of the light emitting elements LD.

The width w1 of the first direction DR1 of the first electrode EL1 and the width w2 of the first direction DR1 of the second electrode EL2 may be similar to or substantially identical to each other. However, the disclosure is not limited thereto, and according to an embodiment, the width w2 of the first direction DR1 of the second electrode EL2 may be greater than the width w1 of the first direction DR1 of the first electrode EL1.

As described above, when at least a portion of the first electrode EL1 and the second electrode EL2 provided on different layers with the passivation layer PSV interposed therebetween is designed to overlap, a short defect between the first electrode EL1 and the second electrode EL2, which may occur due to a spatial limitation in a manufacturing step or the like of each pixel PXL, may be minimized. In addition, when the first electrode EL1 and the second electrode EL2 are disposed to overlap, a high resolution and fine pitch display device may be easily implemented by more efficiently utilizing the pixel area PXA of each pixel PXL.

Figure 14:
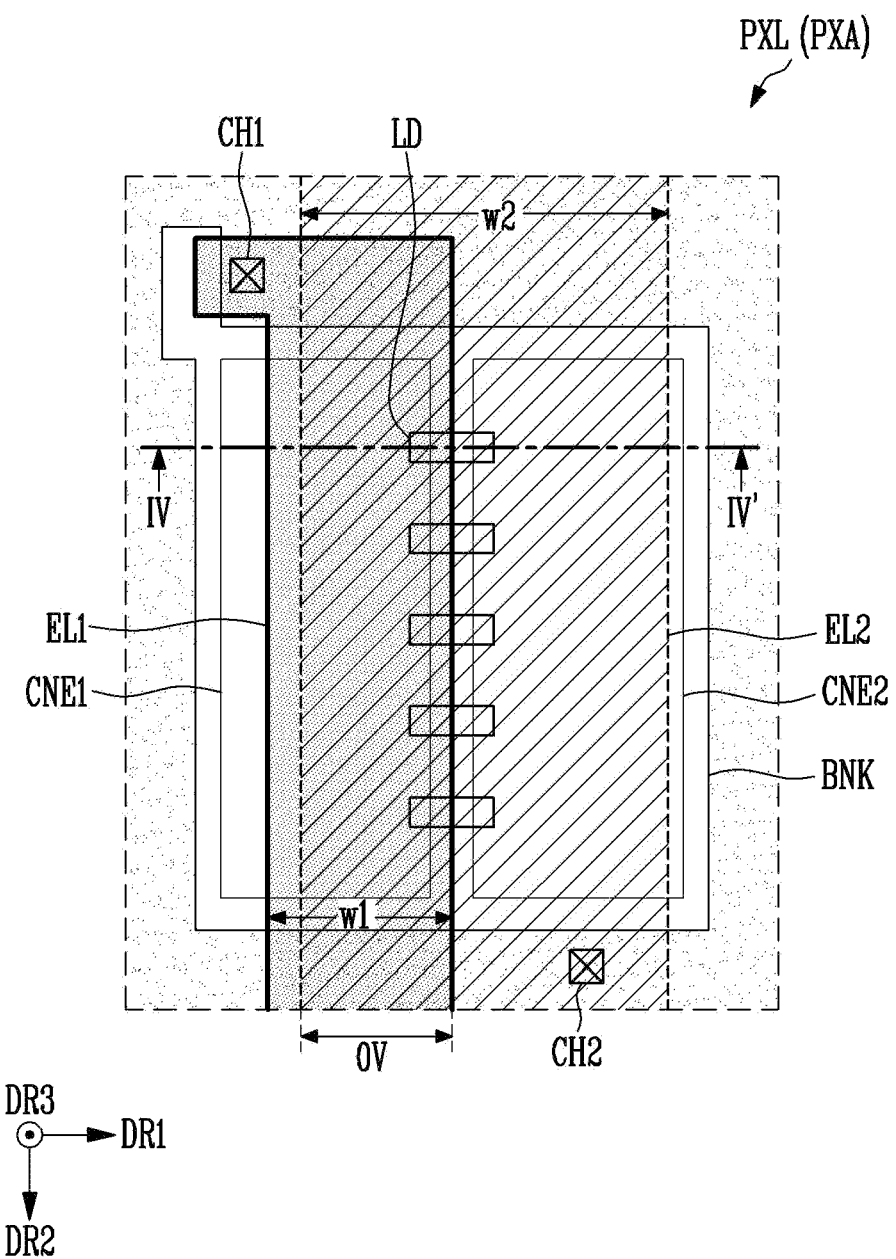
FIG. 14 is a plan view schematically illustrating a pixel according to still another embodiment of the disclosure.
Figure 15:
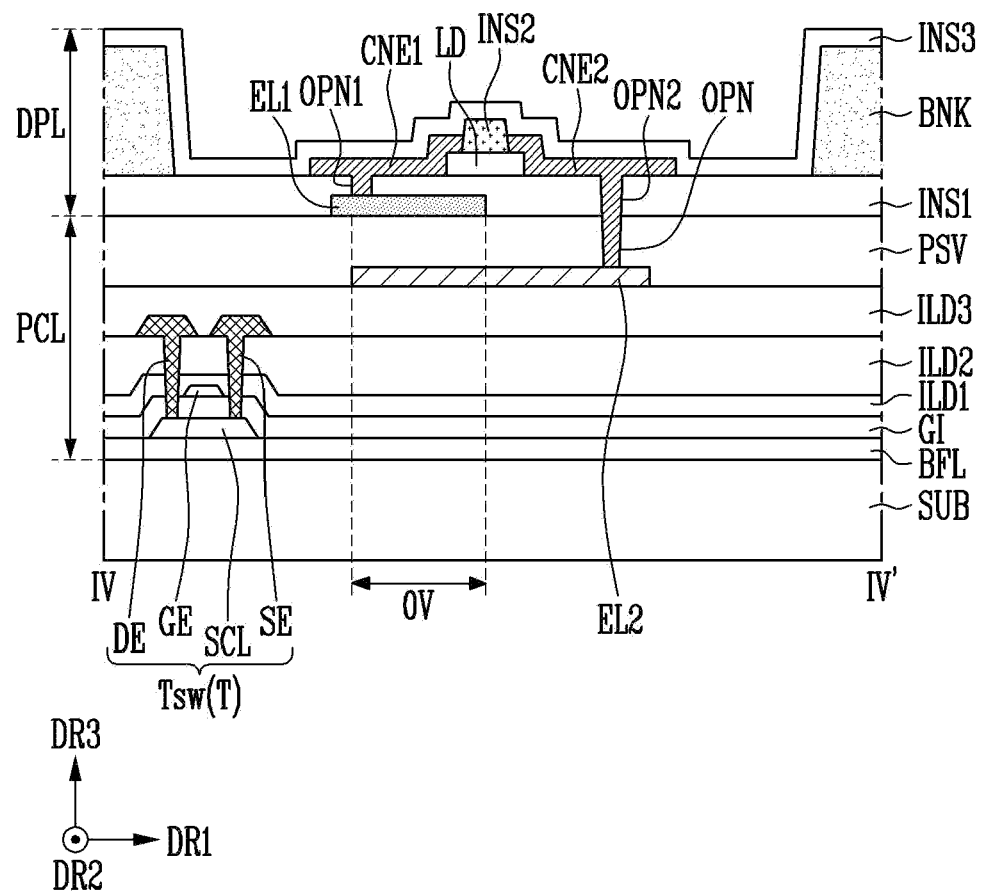
FIG. 15 is a cross-sectional view taken along a line IV~IV' of FIG. 14.

FIG. 14 is a plan view schematically illustrating a pixel according to still another embodiment of the disclosure, and FIG. 15 is a cross-sectional view taken along a line IV~IV' of FIG. 14. The pixel shown in FIGS. 14 and 15 may have a configuration substantially identical or similar to that of the pixel of FIGS. 12 and 13 except that the width of the first direction DR1 of the second electrode EL2 is expanded.

Therefore, regarding the pixel of FIGS. 14 and 15, a point different from the above-described embodiment is mainly described in order to avoid repetitive description.

Referring to FIGS. 1 to 4, 14 and 15, the second electrode EL2 may be the width w2 in the first direction DR1, which is greater than that of the first electrode EL1, and may be provided under the first electrode EL1.

The second electrode EL2 may be expanded in the first direction DR1 so as to overlap the remaining portion except for a portion of the first electrode EL1 on the plan view. For example, the second electrode EL2 may be provided in a plate shape corresponding to the light emission area of the pixel area PXA of each pixel PXL. In an embodiment of the disclosure, the shape of the second electrode EL2 may be changed in various forms within a range that does not directly or indirectly affect the configurations included in the pixel circuit layer PCL.

When the second electrode EL2 is positioned under the first electrode EL1 between the pixel circuit layer PCL and the display element layer DPL, is expanded in a plate shape, and is provided, the second electrode EL2 may be used as a shielding member for blocking the electric field induced from the transistors T and signal lines connected to the transistors T. When the second electrode EL2 is used as the shielding member, misalignment and/or malfunction of the light emitting elements LD may be prevented by minimizing an influence of the electric field on alignment and/or driving of the light emitting elements LD.

The second electrode EL2 may be configured of an opaque conductive material having a constant reflectance in order to cause the light emitted from the light emitting elements LD to progress in the image display direction of the display device. As described above, when the second electrode EL2 is expanded and provided in the plate shape, the overlap region OV with the first electrode EL1 increases, and thus the second electrode EL2 alone may be used as a reflective member guiding the light emitted from the light emitting elements LD in the image display direction of the display device. Accordingly, an amount of light emitted from the light emitting elements LD and progressing in the image display direction of the display device may be increased by the second electrode EL2 having a relatively large area (or size) compared to the first electrode EL1, and thus the light emission efficiency of each pixel PXL may be improved. In this case, the light emission efficiency of each pixel PXL may be further improved by minimizing the loss of the light emitted from the light emitting elements LD by configuring the first electrode EL1 with a transparent conductive material.

In addition, when the second electrode EL2 is expanded in the plate shape and provided, the overlap region OV of the first electrode EL1 and the second electrode EL2 may be further secured on the plan view and the cross-sectional view. Accordingly, a short defect between the first electrode EL1 and the second electrode EL2, which may occur due to a spatial limitation in a manufacturing step or the like of each pixel PXL, may be minimized.

Figure 16:
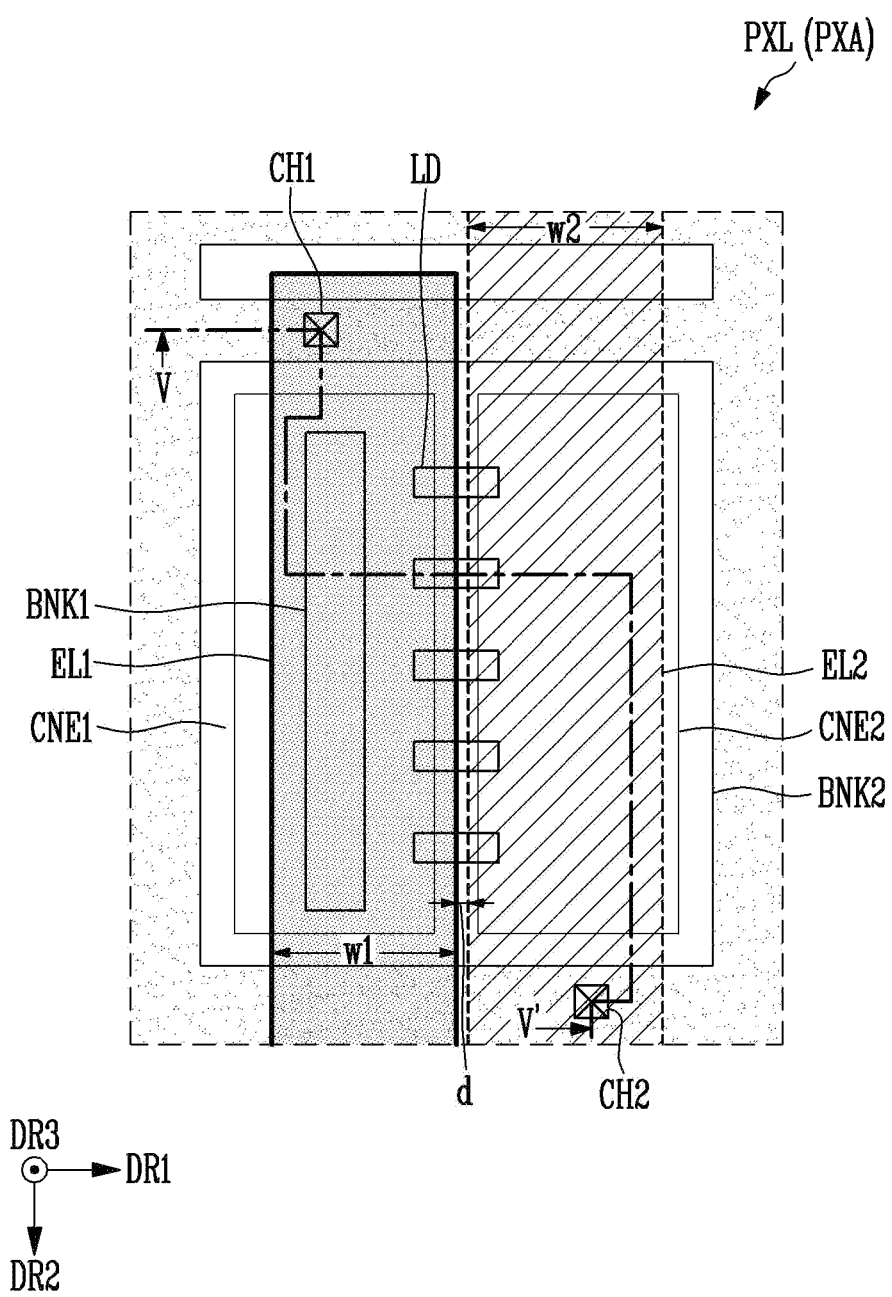
FIG. 16 is a plan view schematically illustrating a pixel according to still another embodiment of the disclosure.
Figure 17:
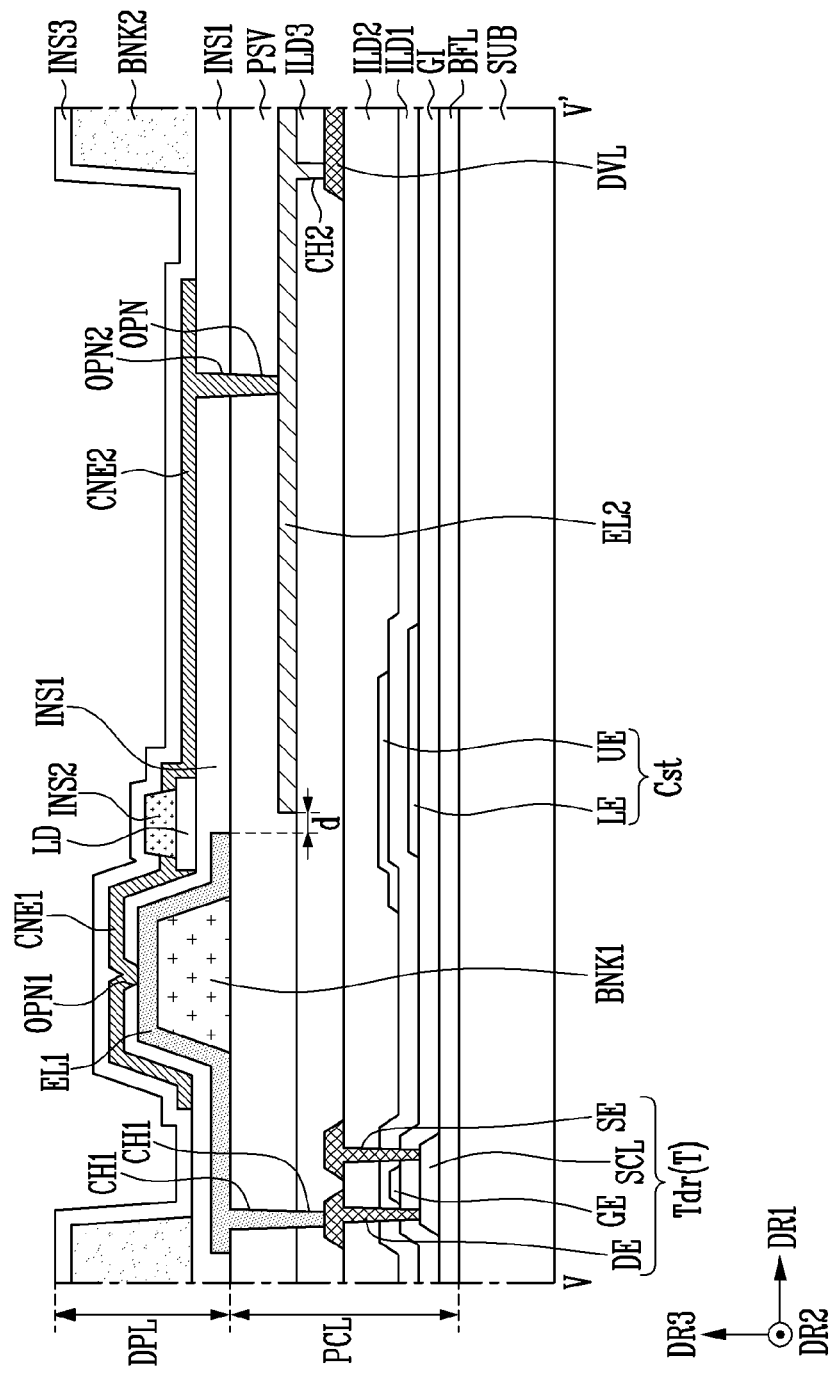
FIG. 17 is a cross-sectional view taken along a line V~V' of FIG. 16.

FIG. 16 is a plan view schematically illustrating a pixel according to still another embodiment of the disclosure, and FIG. 17 is a cross-sectional view taken along a line V~V' of FIG. 16.

The pixel shown in FIGS. 16 and 17 may have a configuration substantially identical or similar to that of the pixel of FIGS. 5 to 8 except that a bank pattern BNK1 is disposed on the passivation layer PSV.

Therefore, regarding the pixel of FIGS. 16 and 17, a point different from the above-described embodiment is mainly described in order to avoid repetitive description.

Referring to FIGS. 1 to 4, 16 and 17, the substrate SUB, the pixel circuit layer PCL, and the display element layer DPL may be disposed in the pixel area PXA of each pixel PXL.

The pixel circuit layer PCL may include at least one insulating layer, at least one transistor T, and the second electrode EL2.

The display element layer DPL may include first and second bank patterns BNK1 and BNK2, the first electrodes EL1, the light emitting elements LD, the first and second contact electrodes CNE1 and CNE2, and the first to third insulating layers INS1 to INS3.

The first bank pattern BNK1 may be positioned in the light emission area in which light is emitted from the pixel area PXA of each pixel PXL. The first bank pattern BNK1 may be a support member supporting the first electrode EL1 so as to change a surface profile (or shape) of the first electrode EL1 to guide the light emitted from the light emitting elements LD in the image display direction of the display device.

The first bank pattern BNK1 may be provided between the passivation layer PSV and the first electrode EL1 in the light emission area of the corresponding pixel PXL.

The first bank pattern BNK1 may be an inorganic insulating film including an inorganic material or an organic insulating film including an organic material. According to an embodiment, the first bank pattern BNK1 may include an organic insulating film of a single film and/or an inorganic insulating film of a single film, but the disclosure is not limited thereto. According to an embodiment, the first bank pattern BNK1 may be provided in a form of multiple films in which at least one organic insulating film and at least one inorganic insulating film are stacked. However, the material of the first bank pattern BNK1 is not limited to the above-described embodiment, and according to an embodiment, the first bank pattern BNK1 may include a conductive material.

The first bank pattern BNK1 may have a cross-section of a trapezoid shape in which a width becomes narrower from one surface (for example, an upper surface) of the passivation layer PSV toward an upper portion in the third direction DR3, but the disclosure is not limited thereto. According to an embodiment, the first bank pattern BNK1 may include a curved surface having a cross-section such as a semi-elliptical shape, or a semi-circular shape (or a hemispherical shape), in which a width becomes narrower from one surface of the passivation layer PSV toward an upper portion in the third direction DR3. On the cross-sectional view, the shape of the first bank pattern BNK1 is not limited to the above-described embodiments and may be variously changed within a range capable of improving efficiency of the light emitted from each of the light emitting elements LD.

On the plan view, the first bank pattern BNK1 may have a bar shape extending along the second direction DR2, but the disclosure is not limited thereto. According to an embodiment, the shape of the first bank pattern BNK1 may be variously changed.

The second bank pattern BNK2 may be provided and/or formed in a peripheral area of the pixel area PXA of each pixel PXL. The second bank pattern BNK2 may have the same configuration as the bank BNK described with reference to FIGS. 5 to 8. Accordingly, description of the second bank pattern BNK2 is omitted.

The first electrode EL1 may be provided and/or formed on the first bank pattern BNK1. Since the first electrode EL1 has a surface profile corresponding to the shape of the first bank pattern BNK1 disposed thereunder, the light emitted from each of the light emitting elements LD may be reflected by the first electrode EL1 and may further progress in the image display direction of the display device. The first bank pattern BNK1 and the first electrode EL1 may function as a reflective member that guide the light emitted from the light emitting elements LD in a desired direction to improve light efficiency of the display device.

At this time, the first bank pattern BNK1 may not be provided on the second electrode EL2. In particular, in order to prevent the light emitted from the light emitting elements LD and progressing in the image display direction of the display device by the second electrode EL2 from being dispersed by a structure such as the first bank pattern BNK1, the first bank pattern BNK1 may not be provided on the electrode EL2. However, the disclosure is not limited thereto, and the first bank pattern BNK1 may be provided on the second electrode EL2 according to an embodiment.

The second electrode EL2 of the pixel circuit layer PCL and the first electrode EL1 of the display element layer DPL may be disposed to be spaced apart from each other with the passivation layer PSV interposed therebetween. That is, the first electrode EL1 and the second electrode EL2 may be provided on different layers and disposed to be spaced apart with the passivation layer PSV interposed therebetween. Accordingly, a short defect between the first electrode EL1 and the second electrode EL2, which may occur due to a spatial limitation in a manufacturing step or the like of each pixel PXL, may be minimized.

Figure 18:
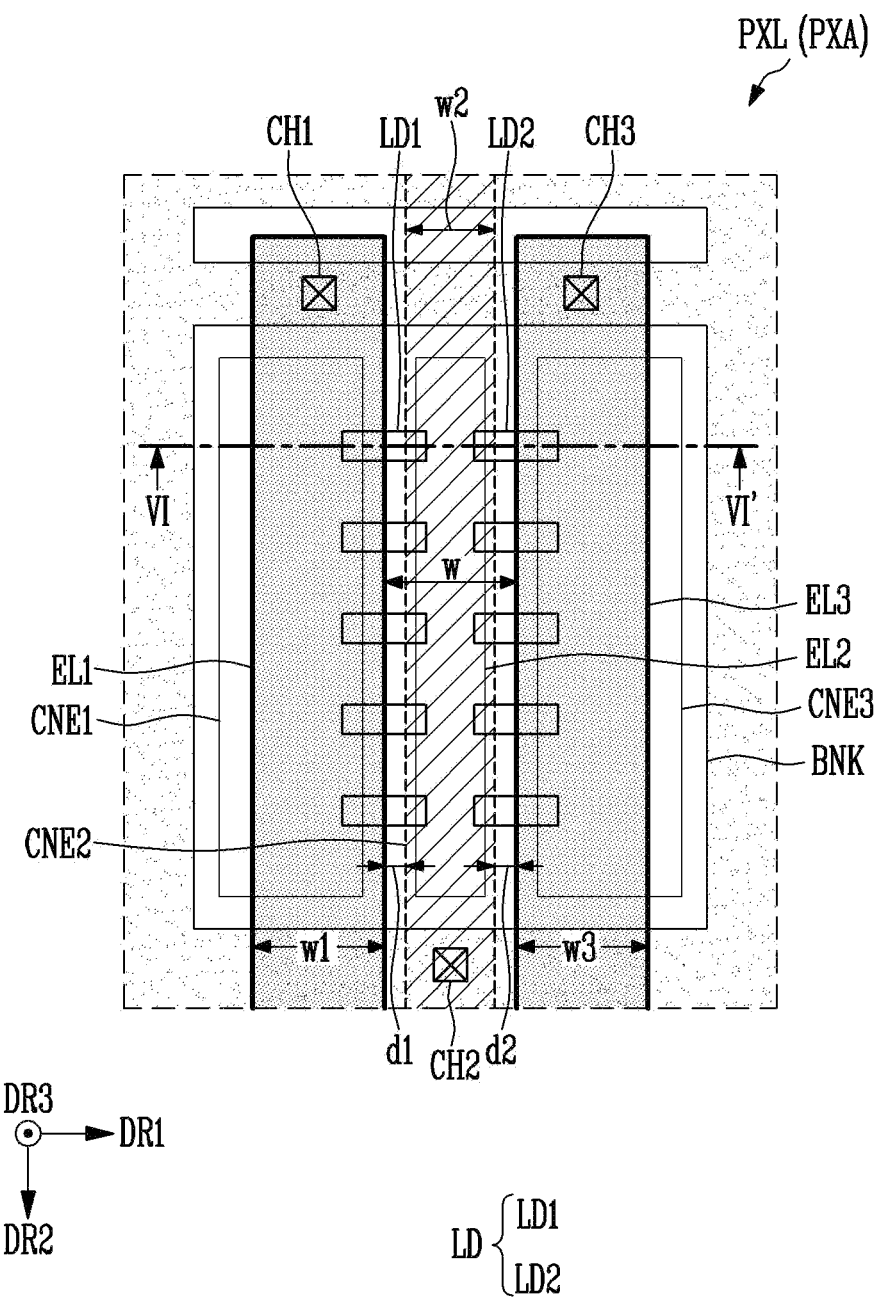
FIG. 18 is a plan view schematically illustrating a pixel according to still another embodiment of the disclosure.
Figure 19:
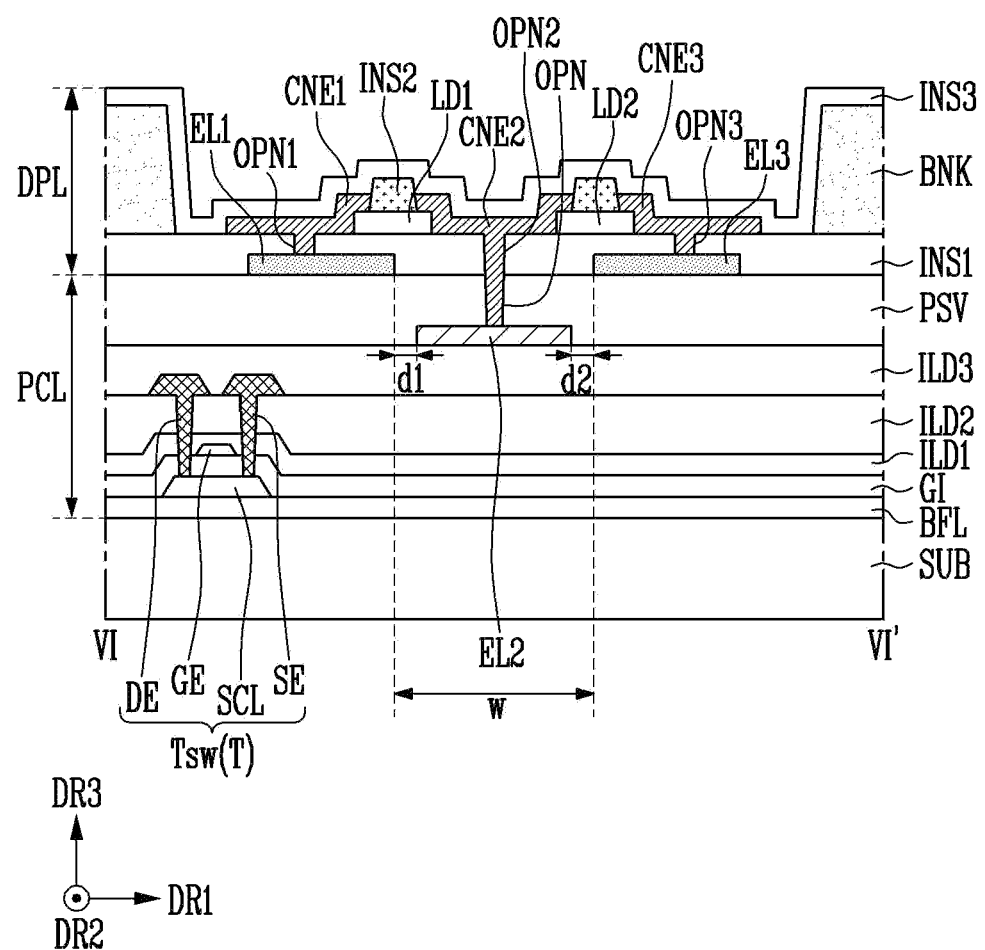
FIG. 19 is a cross-sectional view taken along a line VI~VI' of FIG. 18.

FIG. 18 is a plan view schematically illustrating a pixel according to still another embodiment of the disclosure, and FIG. 19 is a cross-sectional view taken along a line VI~VI' of FIG. 18. The pixel shown in FIGS. 18 and 19 may have a configuration substantially identical or similar to that of the pixel of FIGS. 5 to 8 except that the third electrode EL3 and the third contact electrode CNE3 are added and the second electrode EL2 is disposed between the first electrode EL1 and the third electrode EL3 on the plan view. Therefore, regarding the pixel of FIGS. 18 and 19, a point different from the above-described embodiment is mainly described in order to avoid repetitive description.

Referring to FIGS. 1 to 4, 18, and 19, the substrate SUB, the pixel circuit layer PCL, and the display element layer DPL may be disposed in each pixel area PXA of the pixels PXL.

The pixel circuit layer PCL may include at least one insulating layer, at least one transistor T, and the second electrode EL2. The second electrode EL2 may be provided on the third interlayer insulating layer ILD3.

The display element layer DPL may include the bank BNK, the first and third electrodes EL1 and EL3, the light emitting elements LD, the first to third contact electrodes CNE1 to CNE3, and the first to third insulating layers INS1 to INS3.

The first and third electrodes EL1 and EL3 may be provided on the passivation layer PSV and may be disposed to be spaced apart in the first direction DR1. Each of the first and third electrodes EL1 and EL3 may extend in the direction different from the first direction DR1, for example, the second direction DR2 crossing the first direction DR1. The width w1 of the first direction DR1 of the first electrode EL1 and a width w3 of the first direction DR1 of the third electrode EL3 may be the same, but the disclosure is limited thereto.

The first electrode EL1 and the third electrode EL3 may be provided on the same surface, for example, on one surface (or an upper surface) of the passivation layer PSV, and may be disposed to be spaced apart in the first direction DR1. At this time, a width w of the first direction DR1 between the first electrode EL1 and the third electrode EL3 may be 4 μm to 24 μm, but the disclosure is not limited thereto. The width w between the first electrode EL1 and the third electrode EL3 may be variously adjusted within a range in which the first electrode EL1 and the third electrode EL3 are sufficiently spaced apart in the first direction DR1.

The first and third electrodes EL1 and EL3 may be formed of a conductive material (or material) having a constant reflectance.

The first electrode EL1 may be electrically connected to the first transistor T1 of the pixel circuit PXC of the corresponding pixel PXL through the first contact hole CH1. The third electrode EL3 may be electrically connected to the first transistor T1 through a third contact hole CH3.

The second electrode EL2 may be disposed to be spaced apart from the first and third electrodes EL1 and EL3 with the passivation layer PSV interposed therebetween on the cross-sectional view. The second electrode EL2 may be disposed to be spaced apart from the first electrode EL1 at a first interval d1 (or a first distance) in the first direction DR1 on the plan view. In addition, the second electrode EL2 may be disposed to be spaced apart from the third electrode EL3 at a second interval d2 (or a second distance) in the first direction DR1 on the plan view. At this time, the first interval d1 and the second interval d2 may be the same, but the disclosure is not limited thereto. According to an embodiment, the first interval d1 and the second interval d2 may be different.

The first to third electrodes EL1 to EL3 may function as alignment electrodes (or alignment lines) for alignment of the light emitting elements LD in each pixel PXL. In addition, the first to third electrodes EL1 to EL3 may function as driving electrodes driving the light emitting elements LD after the alignment of the light emitting elements LD.

The light emitting elements LD may be disposed between the first electrode EL1 and the second electrode EL2 and between the second electrode EL2 and the third electrode EL3, on the plan view. For example, first light emitting elements LD1 may be aligned and/or disposed between the first electrode EL1 and the second electrode EL2, and second light emitting elements LD2 may be aligned and/or disposed between the second electrode EL2 and the third electrode EL3.

The first light emitting elements LD1 may overlap the first and second electrodes EL1 and EL2 on the plan view and the cross-sectional view. For example, one end of each of the first light emitting elements LD1 may overlap the first electrode EL1, and another end of each of the first light emitting elements LD1 may overlap the second electrodes EL2, on the plan view and the cross-sectional view. The first light emitting elements LD1 may be aligned on the first insulating layer INS1 to overlap each of the first and second electrodes EL1 and EL2 and overlap a spaced apart region between the first electrode EL1 and the second electrode EL2 on the plan view.

The second light emitting elements LD2 may overlap the second and third electrodes EL2 and EL3 on the plan view and the cross-sectional view. For example, one end of each of the second light emitting elements LD2 may overlap the second electrode EL2, and another end of each of the second light emitting elements LD2 may overlap the three electrodes EL3, on the plan view and the cross-sectional view. The second light emitting elements LD2 may be aligned on the first insulating layer INS1 to overlap each of the second and third electrodes EL2 and EL3 and overlap a spaced apart region between the second electrode EL2 and the third electrode EL3, on the plan view.

The first contact electrode CNE1 may be provided on the first electrode EL1, the second contact electrode CNE2 may be provided on the second electrode EL2, and the third contact electrode CNE3 may be provided on the third electrode EL3. The first to third contact electrodes CNE1 to CNE3 may be provided on the same layer and include the same material.

The first electrode EL1 may be electrically and/or physically connected to the first contact electrode CNE1 through the first opening OPN1 passing through the first insulating layer INS1.

The second electrode EL2 may be electrically and/or physically connected to the second contact electrode CNE2 through the second opening OPN2 of the first insulating layer INS1 and the opening OPN of the passivation layer PSV.

The third electrode EL3 may be electrically and/or physically connected to the third contact electrode CNE3 through the third opening OPN3 passing through the first insulating layer INS1.

As described above, the second electrode EL2 and the first and third electrodes EL1 and EL3 may be provided on different layers with the passivation layer PSV interposed therebetween, and may be disposed to be spaced apart from each other. For example, the first and third electrodes EL1 and EL3 may be provided on the second electrode EL2 with the passivation layer PSV interposed therebetween. When the second electrode EL2 and the first and third electrodes EL1 and EL3 are separated and disposed on different layers, and the first electrode EL1 and the third electrode EL3 provided on the same layer are disposed to be spaced apart, a short defect between the first electrode EL1 and the second electrode EL2 and between the second electrode EL2 and the third electrode EL3, which may occur due to a spatial limitation in a manufacturing step or the like of each pixel PXL, may be minimized.

Figure 20:
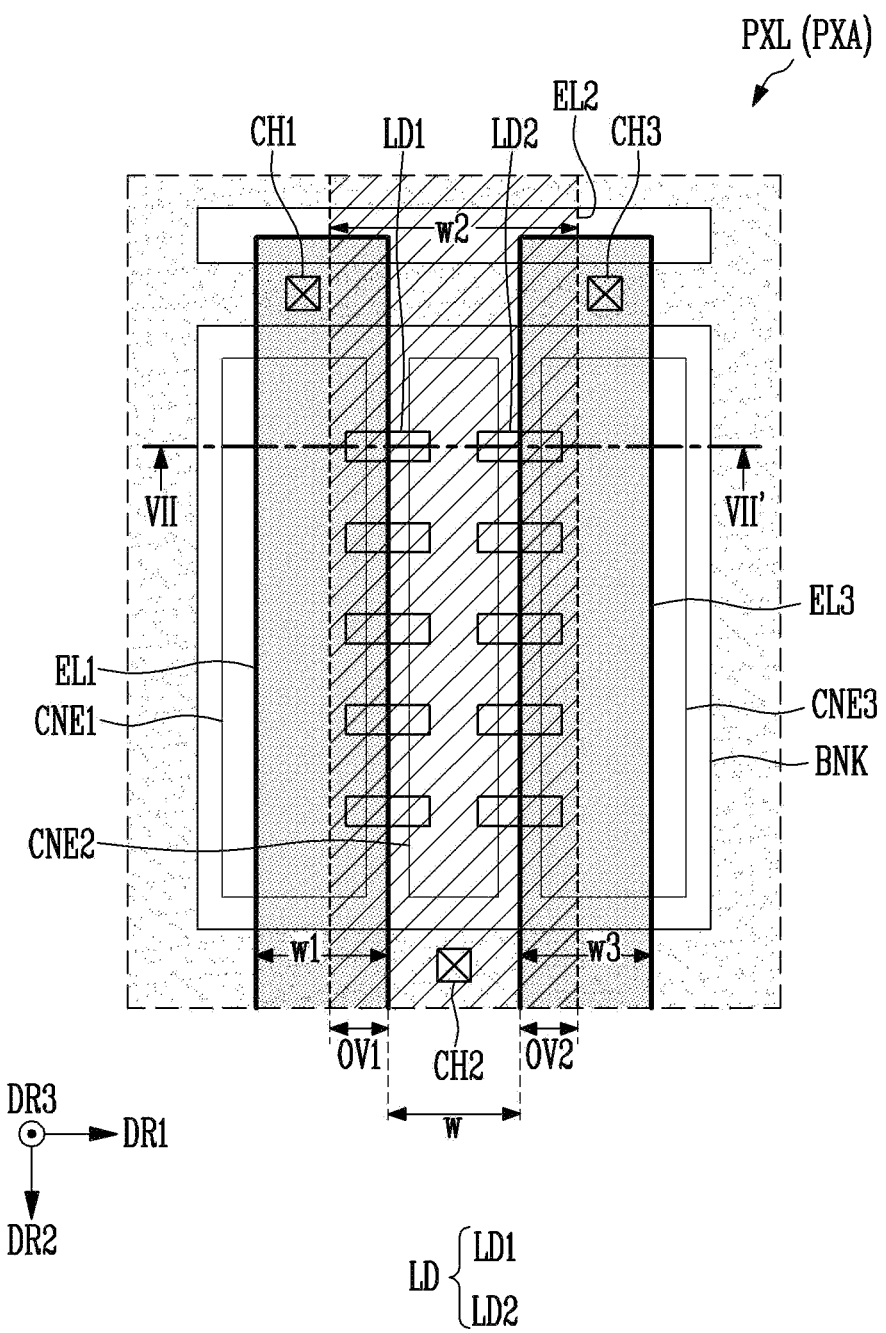
FIG. 20 is a plan view schematically illustrating a pixel according to still another embodiment of the disclosure.
Figure 21:
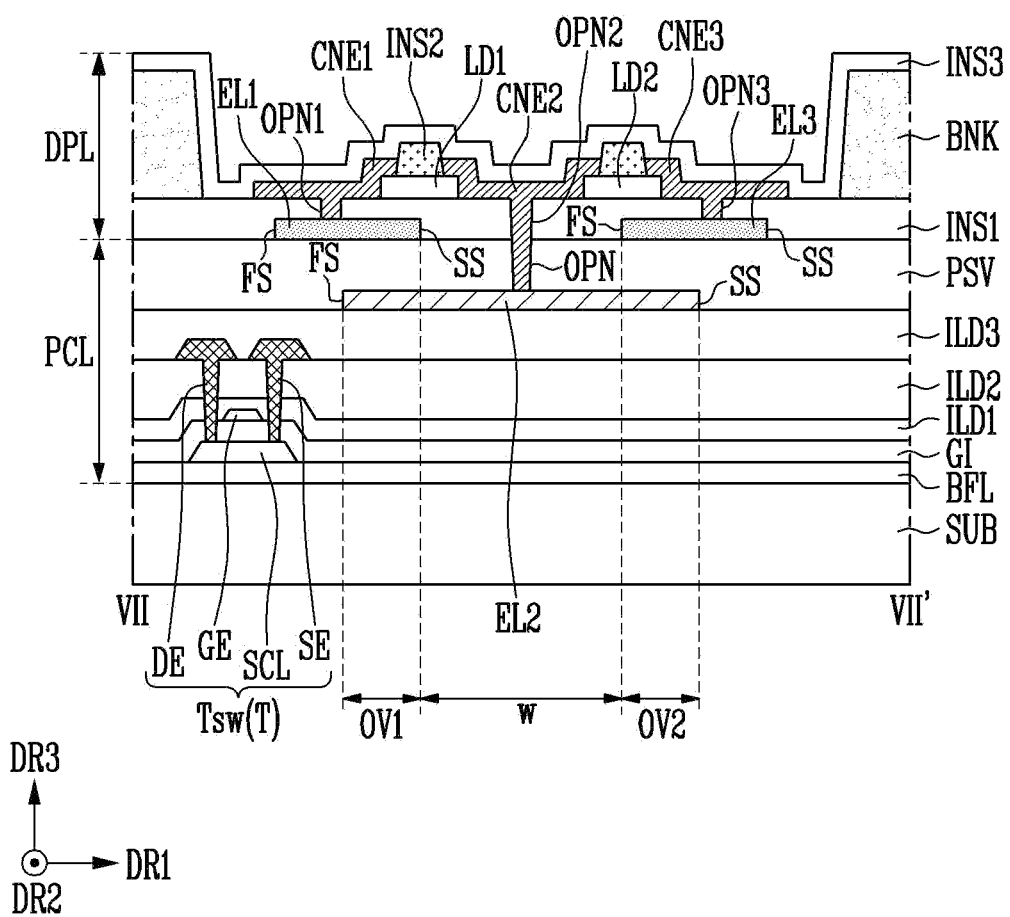
FIG. 21 is a cross-sectional view taken along a line VII~VII' of FIG. 20.
Figure 22:
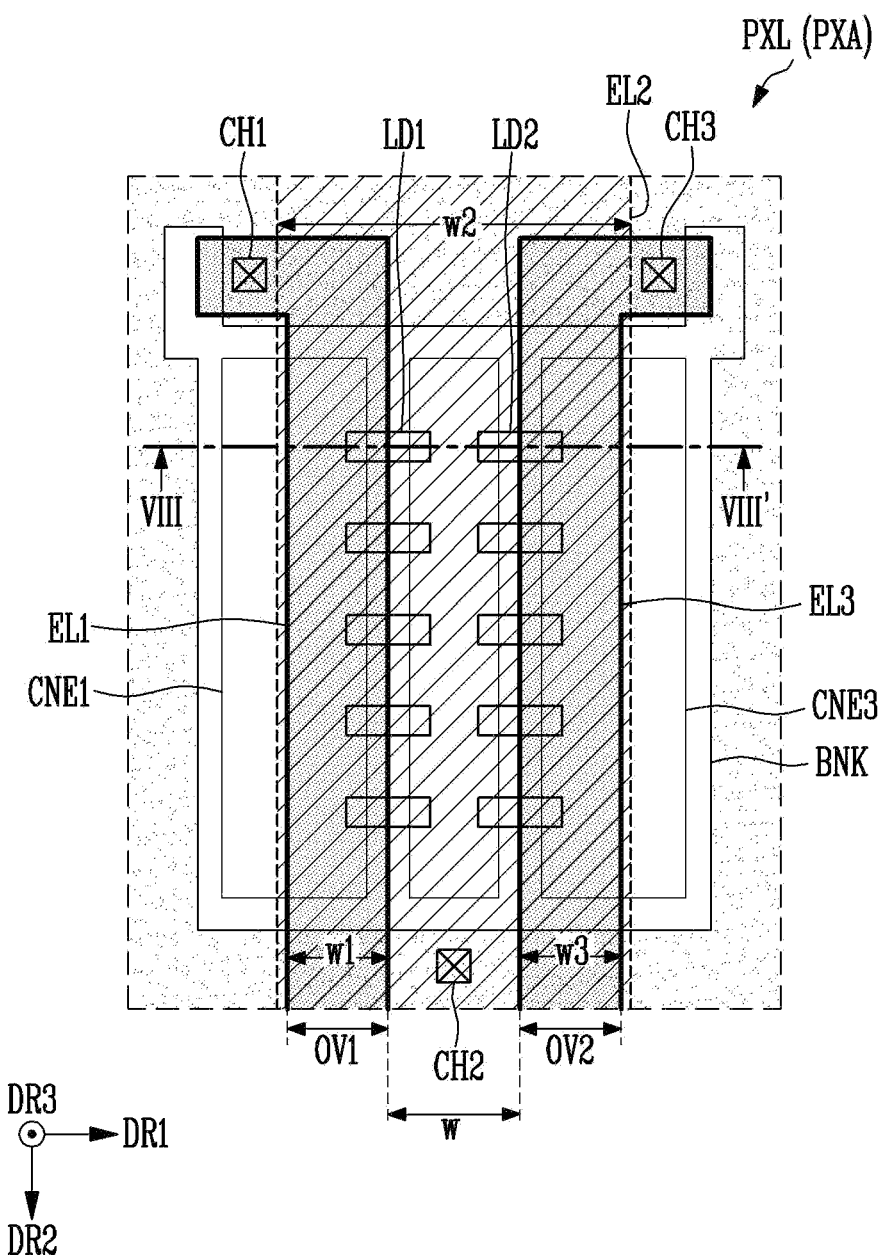
FIG. 22 is a schematic plan view of the second electrode implemented according to another embodiment in the pixel of FIG. 20.
Figure 23:
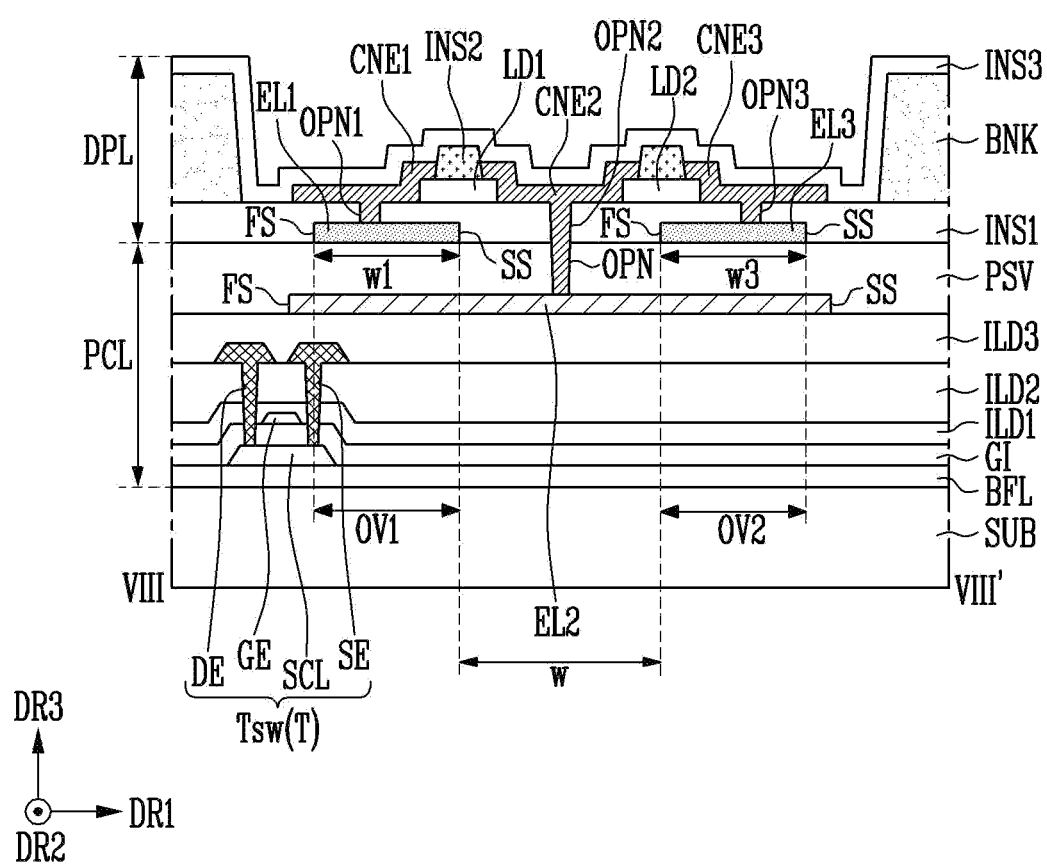
FIG. 23 is a cross-sectional view taken along a line VIII~VIII' of FIG. 22.

FIG. 20 is a plan view schematically illustrating a pixel according to still another embodiment of the disclosure, FIG. 21 is a cross-sectional view taken along a line VII~VII' of FIG. 20, FIG. 22 is a schematic plan view of the second electrode implemented according to another embodiment in the pixel of FIG. 20, and FIG. 23 is a cross-sectional view taken along a line VIII~VIII' of FIG. 22.

The pixel shown in FIGS. 20 to 23 may have a configuration substantially identical or similar to that of the pixel of FIGS. 18 and 19 except that the first and third electrodes EL1 and EL3 and the second electrode EL2 partially overlap.

Therefore, regarding the pixel of FIGS. 20 to 23, a point different from the above-described embodiment is mainly described in order to avoid repetitive description.

Referring to FIGS. 1 to 4 and 20 to 23, the second electrode EL2 may have a width w2 greater than that of each of the first and third electrodes EL1 and EL3 in the first direction DR1 and may be provided under the first and third electrodes EL1 and EL3.

The second electrode EL2 may be provided in a plate shape expanded in the first direction DR1 so as to overlap the remaining portion except for at least a portion of each of the first and third electrodes EL1 and EL3 on the plan view. For example, as shown in FIGS. 20 and 21, the second electrode EL2 may be provided in the plate shape expanded in the first direction DR1 so that one side surface FS of the second electrode EL2 is adjacent to the first light emitting elements LD1 more than one side surface FS of the first electrode EL1 and another side surface SS of the second electrode EL2 is adjacent to the second emitting elements LD2 more than another side surface SS of the third electrode EL3. However, the disclosure is not limited thereto. According to an embodiment, as shown in FIGS. 22 and 23, the second electrode EL2 may be provided in the plate shape expanded in the first direction DR1 so that one the side surface FS of the second electrode EL2 is adjacent to the bank BNK more than the one side surface FS of the first electrode EL1 and the other side surface SS of the second electrode EL2 is adjacent to the bank BNK more than the other side surface SS of the third electrode EL3.

Each of the first and third electrodes EL1 and EL3 and the second electrode EL2 may overlap on the plan view and the cross-sectional view. For example, the first electrode EL1 and the second electrode EL2 may include a region OV1 where the first electrode EL1 and the second electrode EL2 overlap (hereinafter referred to as a "first overlap region") on the plan view and the cross-sectional view. In addition, the third electrode EL3 and the second electrode EL2 may include a region OV2 where the third electrode EL3 and the second electrode EL2 overlap (hereinafter referred to as a "second overlap region") on the plan view and the cross-sectional view.

A width of the first direction DR1 of the first overlap region OV1 may be less than the width w1 of the first direction DR1 of the first electrode EL1 as shown in FIGS. 20 and 21, but the disclosure is not limited thereto. According to an embodiment, the width of the first direction DR1 of the first overlap region OV1 may be the same as the width w1 of the first direction DR1 of the first electrode EL1 as shown in FIGS. 22 and 23. A width of the first direction DR1 of the second overlap region OV2 may be less than the width w3 of the first direction DR1 of the third electrode EL3 as shown in FIGS. 20 and 21, but the disclosure is not limited thereto. According to an embodiment, the width of the first direction DR1 of the second overlap region OV2 may be the same as the width w3 of the first direction DR1 of the third electrode EL3 as shown in FIGS. 22 and 23.

The width of the first direction DR1 of the first overlap region OV1 and the width of the first direction DR1 of the second overlap region OV2 may be the same, but the disclosure is not limited thereto. The width of the first direction DR1 of the first overlap region OV1 and the width of the first direction DR1 of the second overlap region OV2 may be determined according to an adjustment of an arrangement position of the first to third electrodes EL1 to EL3.

The first overlap region OV1 may correspond to a region in which the first light emitting elements LD1 are positioned. For example, the first overlap region OV1 may at least partially overlap the first light emitting elements LD1 on the plan view. The second overlap region OV2 may correspond to a region in which the second light emitting elements LD2 are positioned. For example, the second overlap region OV2 may at least partially overlap the second light emitting elements LD2 on the plan view.

As described above, when the second electrode EL2 is positioned under the first and third electrodes EL1 and EL3 between the pixel circuit layer PCL and the display element layer DPL, expanded in the plate shape, and is provided, the second electrode EL2 may be used as a shielding member. When the second electrode EL2 is used as the shielding member, the electric field induced by the configurations included in the pixel circuit layer PCL may be blocked, and thus misalignment and/or malfunction of the first and second light emitting elements LD1 and LD2 may be prevented.

In addition, when the second electrode EL2 is expanded in the plate shape and provided, the first overlap region OV1 and the second overlap region OV2 may be further secured on the plan view and the cross-sectional view. Accordingly, a short defect between the first electrode EL1 and the second electrode EL2 and between the second electrode EL2 and the third electrode EL3, which may occur due to a spatial limitation in a manufacturing step or the like of each pixel PXL, may be minimized.

Additionally, when the second electrode EL2 is expanded in the plate shape and provided, the second electrode EL2 alone may be used as a reflective member guiding the light emitted from the first and second light emitting elements LD1 and LD2 in the image display direction of the display device. Accordingly, an amount of light emitted from the first and second light emitting elements LD1 and LD2 and progressing in the image display direction of the display device may be increased by the second electrode EL2 having a relatively large area (or size) compared to the first and third electrodes EL1 and EL3, and thus the light emission efficiency of each pixel PXL may be improved. In this case, the light emission efficiency of each pixel PXL may be further improved by minimizing loss of the light emitted from the first and second light emitting elements LD1 and LD2 by configuring the first and third electrodes EL1 and EL3 with a transparent conductive material.

Figure 24:
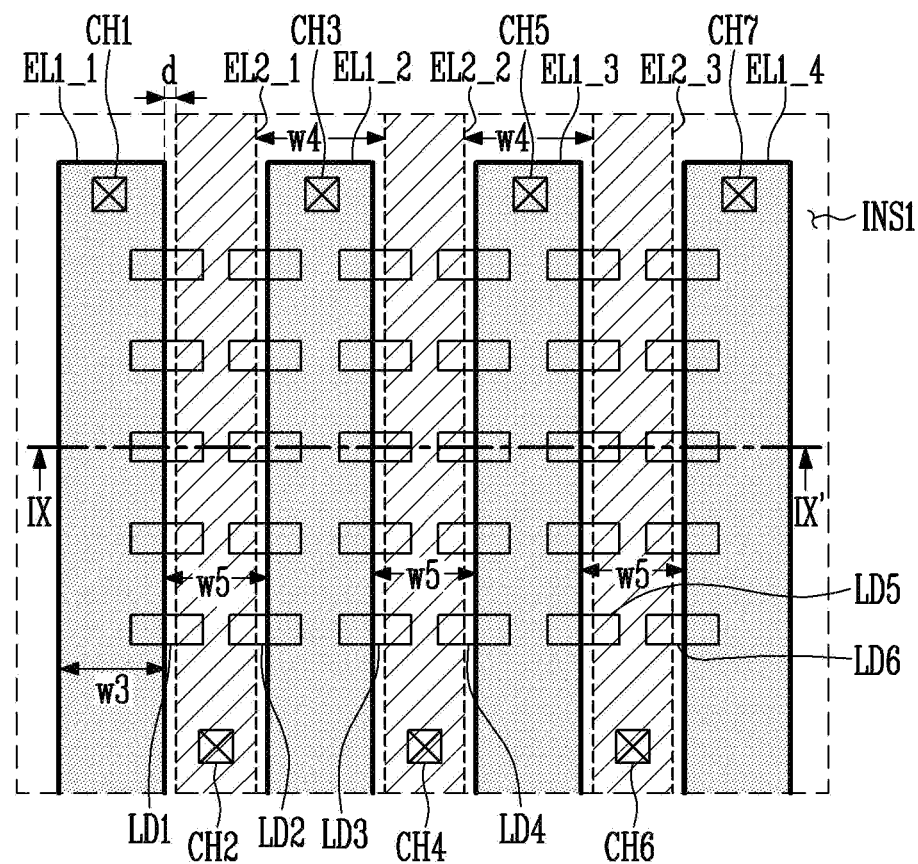
FIG. 24 schematically shows a pixel according to still another embodiment of the disclosure and is a plan view showing only adjacent electrodes and the light emitting element positioned between the adjacent electrodes.
Figure 25A:
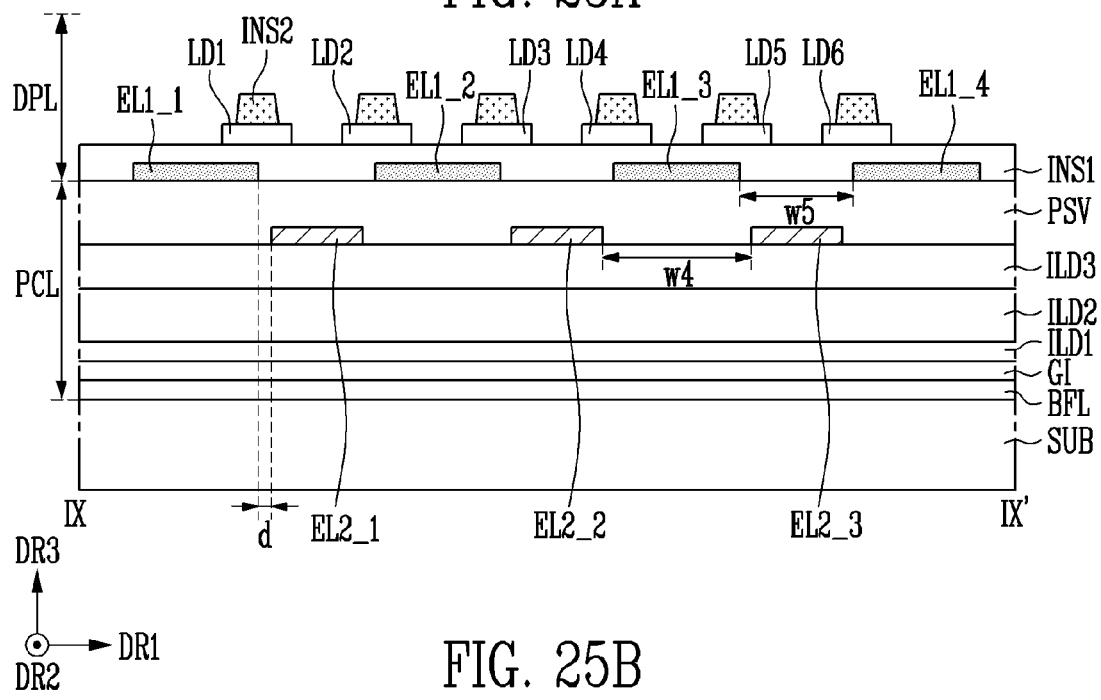
FIGS. 25A and 25B are cross-sectional views taken along a line IX~IX' of FIG. 24.
Figure 25B:
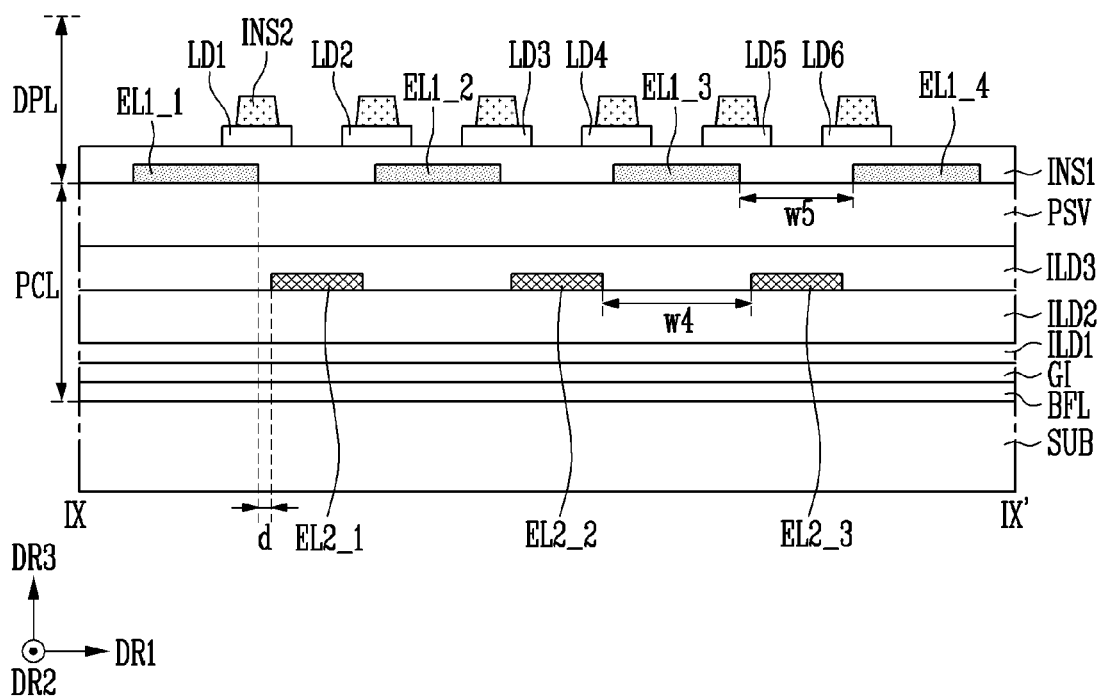

FIG. 24 schematically shows a pixel according to still another embodiment of the disclosure and is a plan view showing only adjacent electrodes and the light emitting element positioned between the adjacent electrodes, and FIGS. 25A and 25B are cross-sectional views taken along a line IX~IX'.

Regarding the embodiment of FIGS. 24 to 25B, a point different from the above-described embodiment is mainly described in order to avoid repetitive description. A portion that is not specifically described in the disclosure follows the above-described embodiment, and the same reference numeral indicates the same component, and a similar reference numeral indicates a similar component.

Referring to FIGS. 1 to 4 and FIGS. 24 to 25B, the substrate SUB, the pixel circuit layer PCL, and the display element layer DPL may be disposed in the pixel area PXA of each pixel PXL.

The pixel circuit layer PCL may include at least one insulating layer, at least one transistor T, and the second electrode EL2. Here, the at least one insulating layer may include the buffer layer BFL, the gate insulating layer GI, the first to third interlayer insulating layers ILD1 to ILD3, and the passivation layer PSV.

The second electrode EL2 of the pixel circuit layer PCL may be provided on any one of the insulating layers. For example, the second electrode EL2 may be provided on the third interlayer insulating layer ILD3 as shown in FIG. 25A. In addition, as another example, the second electrode EL2 may be provided on the second interlayer insulating layer ILD2 as shown in FIG. 25B. When the second electrode EL2 is provided on the second interlayer insulating layer ILD2, the third interlayer insulating layer ILD3 may not be provided according to an embodiment.

The second electrode EL2 may include a (2-1)th electrode EL2_1, a (2-2)th electrode EL2_2, and a (2-3)th electrode EL2_3 disposed to be spaced apart in the first direction DR1. The (2-1)th electrode EL2_1, the (2-2)th electrode EL2_2, and the (2-3)th electrode EL2_3 may be provided on the same layer and include the same material, for example, an opaque conductive material.

A width w4 of the first direction DR1 between the (2-1)th electrode EL2_1 and the (2-2)th electrode EL2_2 and a width w4 of the first direction DR1 between the (2-2)th electrode EL2_2 and the (2-3)th electrode EL2_3 may be the same, but the disclosure is not limited thereto. According to an embodiment, the width w4 of the first direction DR1 between the (2-1)th electrode EL2_1 and the (2-2)th electrode EL2_2 and the width w4 of the first direction DR1 between the (2-2)th electrode EL2_2 and the (2-3)th electrode EL2_3 may be different from each other. For example, the width w4 between the second electrodes EL2 adjacent in the first direction DR1 may be determined by controlling a size, an arrangement position, and the like of the (2-1)th to (2-3)th electrodes EL2_1 to EL2_3 so that each of the width w4 of the first direction DR1 between the (2-1)th electrode EL2_1 and the (2-2)th electrode EL2_2 and the width w4 of the first direction DR1 between the (2-2)th electrode EL2_2 and the (2-3)th electrode EL2_3 correspond within a range of 4 μm to 24 μm.

The (2-1)th electrode EL2_1 may be electrically connected to the second power line PL2 of the pixel circuit PXC of the corresponding pixel PXL through a second contact hole CH2. The (2-2)th electrode EL2_2 may be electrically connected to the second power line PL2 through a fourth contact hole CH4. The (2-3)th electrode EL2_3 may be electrically connected to the second power line PL2 through a sixth contact hole CH6.

The display element layer DPL may include the bank BNK, the first electrode EL1, the light emitting elements LD, and the first and second insulating layers INS1 and INS2. In addition, although not directly shown in the drawing, the display element layer DPL may further include the first contact electrode provided on the first electrode EL1, the second contact electrode provided on the second electrode EL2, and the third insulating layer provided on the first and second contact electrodes.

The first electrode EL1 of the display element layer DPL may be provided on the passivation layer PSV and may include a (1-1)th electrode EL1_1, a (1-2)th electrode EL1_2, a (1-3)th electrode EL1_3, and a (1-4)th electrode EL1_4 which are spaced apart in the first direction DR1. The (1-1)th electrode EL1_1, the (1-2)th electrode EL1_2, the (1-3)th electrode EL1_3, and the (1-4)th electrode EL1_4 may include the same material, for example, an opaque conductive material or a transparent conductive material.

A width w5 of the first direction DR1 between the (1-1)th electrode EL1_1 and the (1-2)th electrode EL1_2, a width w5 of the first direction DR1 between the (1-2)th electrode EL1_2 and the (1-3)th electrode EL1_3, and a width w5 of the first direction DR1 between the (1-3)th electrode EL1_3 and the (1-4)th electrode EL1_4 may be the same, but the disclosure is not limited thereto. According to an embodiment, the width w5 of the first direction DR1 between the (1-1)th electrode EL1_1 and the (1-2)th electrode EL1_2, the width w5 of the first direction DR1 between the (1-2)th electrode EL1_2 and the (1-3)th electrode EL1_3, and the width w5 of the first direction DR1 between the (1-3)th electrode EL1_3 and the (1-4)th electrode EL1_4 may be different. The width w5 between the first electrodes EL1 adjacent in the first direction DR1 may be determined by controlling a size, an arrangement position, and the like of the (1-1)th to (1-4)th electrodes EL1_1 to EL1_4 so that each of the width w5 of the first direction DR1 between the (1-1)th electrode EL1_1 and the (1-2)th electrode EL1_2, the width w5 of the first direction DR1 between the (1-2)th electrode EL1_2 and the (1-3)th electrode EL1_3, and the width w5 of the first direction DR1 between the (1-3)th electrode EL1_3 and the (1-4)th electrode EL1_4 correspond within a range of 4 μm to 24 μm.

The (1-1)th electrode EL1_1 may be electrically connected to the first transistor T1 of the pixel circuit PXC through a first contact hole CH1. The (1-2)th electrode EL1_2 may be electrically connected to the first transistor T1 through a third contact hole CH3. The (1-3)th electrode EL1_3 may be electrically connected to the first transistor T1 through a fifth contact hole CH5. The (1-4)th electrode EL1_4 may be electrically connected to the first transistor T1 through a seventh contact hole CH7.

The first electrode EL1 and the second electrode EL2 may be arranged in an order of the (1-1)th electrode EL1_1, the (2-1)th electrode EL2_1, the (1-2)th electrode EL1_2, the (2-2)th electrode EL2_2, the (1-3)th electrode EL1_3, the (2-3)th electrode EL2_3, and the (1-4)th electrode EL1_4 along the first direction DR1 on the plan view.

The first electrode EL1 and the second electrode EL2 may not overlap and may be alternately disposed. For example, the first electrode EL1 and the second electrode EL2 may be disposed to be spaced apart by a predetermined interval d (or a distance) so as not to overlap on the plan view. The (2-1)th electrode EL2_1 may be positioned between the (1-1)th electrode EL1_1 and the (1-2)th electrode EL1_2, the (2-2)th electrode EL2_2 may be positioned between the (1-2)th electrode EL1_2 and the (1-3)th electrode EL1_3, and the (2-3)th electrode EL2_3 may be positioned between the (1-3)th electrode EL1_3 and the (1-4)th electrode EL1_4.

An interval d between the (1-1)th electrode EL1_1 and the (2-1)th electrode EL2_1, an interval d between the (2-1)th electrode EL2_1 and the (1-2)th electrode EL1_2, an interval d between the (1-2)th electrode EL1_2 and the (2-2)th electrode EL2_2, an interval d between the (2-2)th electrode EL2_2 and the (1-3)th electrode EL1_3, an interval d between the (1-3)th electrode EL1_3 and the (2-3)th electrode EL2_3, and an interval d between the (2-3)th electrode EL2_3 and the (1-4)th electrode EL1_4 may be the same. For example, on the plan view, the interval d between the first electrode EL1 and the second electrode EL2 provided on different layers may be about 2.5 μm, but the disclosure is not limited thereto.

In the above-described embodiment, an embodiment in which the first electrode EL1 and the second electrode EL2 are disposed at a predetermined interval d is described, but the disclosure is not limited thereto. According to an embodiment, at least one region of the first electrode EL1 and the second electrode EL2 may overlap. For example, the (1-1)th electrode EL1_1 and the (2-1)th electrode EL2_1 may overlap, the (2-1)th electrode EL2_1 and the (1-2)th electrode EL1_2 may overlap, the (1-2)th electrode EL1_2 and the (2-2)th electrode EL2_2 may overlap, the (2-2)th electrode EL2_2 and the (1-3)th electrode EL1_3 may overlap, the (1-3)th electrode EL1_3 and the (2-3)th electrode EL2_3 may overlap, and the (2-3)th electrode EL2_3 and the (1-4)th electrode EL1_4 may overlap.

The first and second electrodes EL1 and EL2 may function as an alignment electrode (or an alignment line) for alignment of the light emitting elements LD in each pixel PXL. In addition, the first and second electrodes EL1 and EL2 may function as a driving electrode driving the light emitting elements LD after the alignment of the light emitting elements LD.

The light emitting elements LD may be arranged between the first electrode EL1 and the second electrode EL2 which are provided on different layers and disposed to be spaced apart with the passivation layer PSV interposed therebetween. For example, first light emitting elements LD1 may be arranged between the (1-1)th electrode EL1_1 and the (2-1)th electrode EL2_1, second light emitting elements LD2 may be arranged between the (2-1)th electrode EL2_1 and the (1-2)th electrode EL1_2, third light emitting elements LD3 may be arranged between the (1-2)th electrode EL1_2 and the (2-2)th electrode EL2_2, fourth light emitting elements LD4 may be arranged between the (2-2)th electrode EL2_2 and the (1-3)th electrode EL1_3, fifth light emitting elements LD5 may be arranged between the (1-3)th electrode EL1_3 and the (2-3)th electrode EL2_3, and sixth light emitting elements LD6 may be arranged between the (2-3)th electrode EL2_3 and the (1-4)th electrode EL1_4.

The first light emitting elements LD1 may overlap the (1-1)th and (2-1)th electrodes EL1_1 and EL2_1 on the plan view and the cross-sectional view. For example, on the plan view and the cross-sectional view, one end of each of the first light emitting elements LD1 may overlap the (1-1)th electrode EL1_1 and another end of each of the first light emitting elements LD1 may overlap the (2-1)th electrode EL2_1. On the plan view, the first light emitting elements LD1 may overlap each of the (1-1)th and (2-1)th electrodes EL1_1 and EL2_1, and may be aligned on the first insulating layer INS1 to correspond to a spaced apart region of the (1-1)th electrode EL1_1 and the (2-1)th electrode EL2_1. When the (1-1)th electrode EL1_1 and the (2-1)th electrode EL2_1 include an overlap region where the (1-1)th electrode EL1_1 and the (2-1)th electrode EL2_1 overlap, the first light emitting elements LD1 may be aligned on the first insulating layer INS1 to correspond to the overlap region, but the disclosure is not limited thereto.

The second light emitting elements LD2 may overlap the (2-1)th and (1-2)th electrodes EL2_1 and EL1_2 on the plan view and the cross-sectional view. For example, on the plan view and the cross-sectional view, one end of each of the second light emitting elements LD2 may overlap the (2-1)th electrode EL2_1, and another end of each of the second light emitting elements LD2 may overlap the (1-2)th electrode EL1_2. On the plan view, the second light emitting elements LD2 may overlap each of the (2-1)th and (1-2)th electrodes EL2_1 and EL1_2, and may be aligned on the first insulating layer INS1 to correspond to a spaced apart region of the (2-1)th electrode EL2_1 and the (1-2)th electrode EL1_2. When the (2-1)th electrode EL2_1 and the (1-2)th electrode EL1_2 include an overlap region where the (2-1)th electrode EL2_1 and the (1-2)th electrode EL1_2 overlap, the second light emitting elements LD2 may be aligned on the first insulating layer INS1 to correspond to the overlap region, but the disclosure is not limited thereto.

The third light emitting elements LD3 may overlap the (1-2)th and (2-2)th electrodes EL1_2 and EL2_2 on the plan view and the cross-sectional view. For example, on the plan view and the cross-sectional view, one end of each of the third light emitting elements LD3 may overlap the (1-2)th electrode EL1_2, and another end of each of the third light emitting elements LD3 may overlap the (2-2)th electrode EL2_2. On the plan view, the third light emitting elements LD3 may overlap each of the (1-2)th and (2-2)th electrodes EL1_2 and EL2_2, and may be aligned on the first insulating layer INS1 to correspond to a spaced apart region of the (1-2)th electrode EL1_2 and the (2-2)th electrode EL2_2. When the (1-2)th electrode EL1_2 and the (2-2)th electrode EL2_2 include an overlap region where the (1-2)th electrode EL1_2 and the (2-2)th electrode EL2_2 overlap, the third light emitting elements LD3 may be aligned on the first insulating layer INS1 to correspond to the overlap region, but the disclosure is not limited thereto.

The fourth light emitting elements LD4 may overlap the (2-2)th and (1-3)th electrodes EL2_2 and EL1_3 on the plan view and the cross-sectional view. For example, on the plan view and the cross-sectional view, one end of each of the fourth light emitting elements LD4 may overlap the (2-2)th electrode EL2_2, and another end of each of the fourth light emitting elements LD4 may overlap the (1-3)th electrode EL1_3. On the plan view, the fourth light emitting elements LD4 may overlap each of the (2-2)th and (1-3)th electrodes EL2_2 and EL1_3, and may be aligned on the first insulating layer INS1 to correspond to a spaced apart region of the (2-2)th electrode EL2_2 and the (1-3)th electrode EL1_3. When the (2-2)th electrode EL2_2 and the (1-3)th electrode EL1_3 include an overlap region where the (2-2)th electrode EL2_2 and the (1-3)th electrode EL1_3 overlap, the fourth light emitting elements LD4 may be aligned on the first insulating layer INS1 to correspond to the overlap region, but the disclosure is not limited thereto.

The fifth light emitting elements LD5 may overlap the (1-3)th and (2-3)th electrodes EL1_3 and EL2_3 on the plan view and the cross-sectional view. For example, on the plan view and the cross-sectional view, one end of each of the fifth light emitting elements LD5 may overlap the (1-3)th electrode EL1_3, and another end of each of the fifth light emitting elements LD5 may overlap the (2-3)th electrode EL2_3. On the plan view, the fifth light emitting elements LD5 may overlap each of the (1-3)th electrode EL1_3 and the (2-3)th electrode EL2_3, and may be aligned on the first insulating layer INS1 to correspond to a spaced apart region of the (1-3)th electrode EL1_3 and the (2-3)th electrode EL2_3. When the (1-3)th electrode EL1_3 and the (2-3)th electrode EL2_3 include an overlap region where the (1-3)th electrode EL1_3 and the (2-3)th electrode EL2_3 overlap, the fifth light emitting elements LD5 may be aligned on the first insulating layer INS1 to correspond to the overlap region, but the disclosure is not limited thereto.

The sixth light emitting elements LD6 may overlap the (2-3)th and (1-4)th electrodes EL2_3 and EL1_4 on the plan view and the cross-sectional view. For example, on the plan view and the cross-sectional view, one end of each of the sixth light emitting elements LD6 may overlap the (2-3)th electrode EL2_3, and another end of each of the sixth light emitting elements LD6 may overlap the (1-4)th electrode EL1_4. On the plan view, the sixth light emitting elements LD6 may overlap each of the (2-3)th electrode EL2_3 and the (1-4)th electrode EL1_4, and may be aligned on the first insulating layer INS1 to correspond to a spaced apart region of the (2-3)th electrode EL2_3 and the (1-4)th electrode EL1_4. When the (2-3)th electrode EL2_3 and the (1-4)th electrode EL1_4 include an overlap region where the (2-3)th electrode EL2_3 and the (1-4)th electrode EL1_4 overlap, the sixth light emitting elements LD6 may be aligned on the first insulating layer INS1 to correspond to the overlap region, but the disclosure is not limited thereto.

The first electrode EL1 and the second electrode EL2 may be provided on different layers with the passivation layer PSV interposed therebetween, and may be disposed to be spaced apart.

As described above, when the first electrode EL1 and the second electrode EL2 are separated and disposed on different layers, a short defect between the first electrode EL1 and the second electrode EL2, which may occur due to a spatial limitation between the first electrode EL1 and the second electrode EL2, may be minimized.

Figure 26:
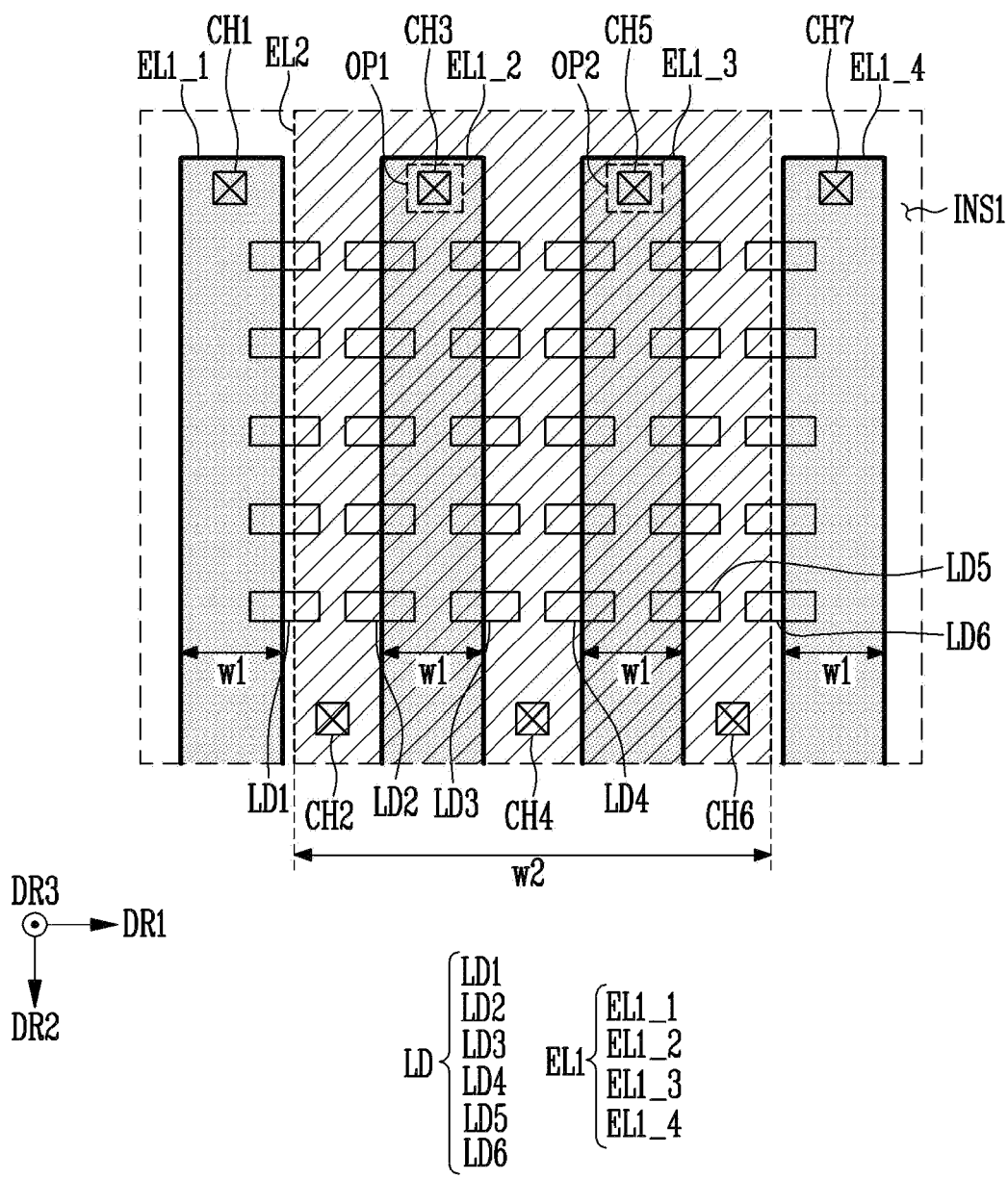
FIG. 26 is a schematic plan view of the second electrode implemented according to another embodiment in the pixel of FIG. 24.

FIG. 26 is a schematic plan view of the second electrode implemented according to another embodiment in the pixel of FIG. 24.

The pixel PXL shown in FIG. 26 may have a configuration substantially identical or similar to that of the pixel of FIGS. 24 to 25B except that the second electrode EL2 is expanded in a plate shape and provided.

Therefore, regarding the pixel of FIG. 26, a point different from the above-described embodiment is mainly described in order to avoid repetitive description.

Referring to FIGS. 1 to 4 and 26, the first electrode EL1 and the second electrode EL2 may be provided at different widths. For example, a width w2 of the first direction DR1 of the second electrode EL2 may be greater than a width w1 of the first direction DR1 of each of the (1-1)th to (1-4)th electrodes EL1_1 to EL1_4.

The second electrode EL2 may be expanded in the first direction DR1 so as to overlap the remaining portion except for a portion of the first electrode EL1 on the plan view. For example, the second electrode EL2 may be provided in a plate shape expanded in the first direction DR1 so as to overlap the (1-2)th and (1-3)th electrodes EL1_2 and EL1_3. In an embodiment of the disclosure, the shape of the second electrode EL2 may be variously changed in a range that does not directly or indirectly affect the configurations included in the pixel circuit PXC of the corresponding pixel PXL. In addition, the second electrode EL2 may include first and second openings OP1 and OP2. The first opening OP1 may correspond to a region in which the third contact hole CH3 electrically connecting the (1-2)th electrode EL1_2 and the first driving transistor T1 of the pixel circuit PXC is positioned. The second opening OP2 may correspond to a region in which the fifth contact hole CH5 electrically connecting the (1-3)th electrode EL1_3 and the first driving transistor T1 is positioned.

As described above, when the second electrode EL2 is expanded in the plate shape and provided, the second electrode EL2 may be utilized as a shielding member that preventing misalignment and/or malfunction of the light emitting elements LD by blocking the electric field induced from the configurations included in the pixel circuit PXC.

Although the disclosure has been described with reference to the preferred embodiment above, those skilled in the art or those having a common knowledge in the art will understand that the disclosure may be various modified and changed without departing from the spirit and technical area of the disclosure described in the claims which will be described later.

Therefore, the technical scope of the disclosure should not be limited to the contents described in the detailed description of the specification, but should be defined by the claims.

DESCRIPTION OF SYMBOLS

SUB: substrate PXL: pixel
PXA: pixel area LD: light emitting element
PCL: pixel circuit layer DPL: display element layer
EMU: light emitting unit PSV: passivation layer
EL1, EL2: first and second electrodes BNK: bank
ILD1~ILD3: first to third interlayer insulating layers
INS1~INS3: first to third insulating layers
BNK1, BNK2: first and second bank patterns
CNE1~CNE3: first to third contact electrodes

What is claimed is:

1. A pixel comprising:
a pixel circuit layer including:
at least one transistor and a first electrode disposed on a substrate; and
a first insulating layer disposed on the at least one transistor and the first electrode; and
a display element layer disposed on the pixel circuit layer, the display element layer including:
a second electrode electrically connected to the at least one transistor, and
a plurality of light emitting elements indirectly electrically connected to each of the first and second electrodes via contact electrodes, wherein
the first electrode and the second electrode are disposed on different layers and are spaced apart from each other,
the plurality of light emitting elements overlap the first and second electrodes in a plan view and a cross-sectional view, and
the second electrode is disposed on a layer under the plurality of light emitting elements.

2. The pixel according to claim 1, wherein the first electrode and the second electrode are spaced apart at a distance in a first direction in a plan view.

3. The pixel according to claim 1, wherein the first electrode and the second electrode overlap each other in a plan view.

4. The pixel according to claim 3, wherein
the second electrode is disposed on the first electrode, and
the first insulating layer is disposed between the second electrode and the first electrode.

5. The pixel according to claim 4, wherein a width of a first direction of the first electrode is greater than a width of the first direction of the second electrode in a plan view and the cross-sectional view.

6. The pixel according to claim 5, wherein the first electrode is in a plate shape and is disposed between the pixel circuit layer and the display element layer.

7. The pixel according to claim 5, wherein
the first electrode includes an opaque conductive material, and the second electrode includes a transparent conductive material.

8. The pixel according to claim 5, wherein a width of an overlap region of the first and second electrodes in the first direction is less than the width of the first electrode in the first direction.

9. The pixel according to claim 1, wherein
the display element layer comprises:
a second insulating layer disposed on the second electrode;
a first contact electrode electrically connecting the first electrode and each of the plurality of light emitting elements; and
a second contact electrode electrically connecting the second electrode and each of the plurality of light emitting elements, and
the plurality of light emitting elements are disposed on the second insulating layer.

10. The pixel according to claim 1, further comprising:
a third electrode disposed on the pixel circuit layer, wherein
the second electrode and the third electrode are disposed on a same layer,
each of the second and third electrodes and the first electrode are spaced apart from each other, and
the first insulating layer is disposed between each of the second and third electrodes and the first electrode.

11. The pixel according to claim 10, wherein the plurality of light emitting elements comprises:
first light emitting elements overlapping the first and second electrodes in a plan view and the cross-sectional view and electrically connected to each of the first and second electrodes; and
second light emitting elements overlapping the first and third electrodes in a plan view and the cross-sectional view and electrically connected to each of the first and third electrodes.

12. The pixel according to claim 10, wherein
the second electrode, the first electrode, and the third electrode are sequentially arranged in a first direction in a plan view, and
each of the first to third electrodes is spaced apart from an adjacent electrode in the first direction.

13. The pixel according to claim 10, wherein the first electrode overlaps each of the second and third electrodes in a plan view.

14. The pixel according to claim 13, wherein a width of the first electrode of a first direction is greater than a width of the first direction of each of the second and third electrodes.

15. The pixel according to claim 1, wherein
the first electrode includes a 1-1-th electrode, a 1-2-th electrode, a 1-3-th electrode, and a 1-4-th electrode spaced apart from each other on the pixel circuit layer,
the second electrode includes a 2-1-th electrode, a 2-2-th electrode, and a 2-3-th electrode spaced apart from each other on the substrate,
the 1-1-th electrode, the 2-1-th electrode, the 1-2-th electrode, the 2-2-th electrode, the 1-3-th electrode, the 2-3-th electrode, and the 1-4-th electrode are sequentially arranged in a first direction in a plan view and the cross-sectional view, and
the first electrode and the second electrode are spaced apart in the first direction in a plan view.

16. The pixel according to claim 15, wherein the plurality of light emitting elements comprises:

first light emitting elements disposed between the 1-1-th electrode and the 2-1-th electrode in a plan view;
second light emitting elements disposed between the 2-1-th electrode and the 1-2-th electrode in a plan view;
third light emitting elements disposed between the 1-2-th electrode and the 2-2-th electrode in a plan view;
fourth light emitting elements disposed between the 2-2-th electrode and the 1-2-th electrode in a plan view;
fifth light emitting elements disposed between the 1-3-th electrode and the 2-3-th electrode in a plan view; and
sixth light emitting elements disposed between the 2-3-th electrode and the 1-4-th electrode on a plan view.

17. The pixel according to claim 1, wherein
the first electrode includes a 1-1-th electrode, a 1-2-th electrode, a 1-3-th electrode, and a 1-4-th electrode spaced apart from each other on the pixel circuit layer, and
the second electrode is in a plate shape and overlaps a portion of the 1-1-th electrode, the 1-2-th electrode, the 1-3-th electrode, and the 1-4-th electrode.

18. A pixel comprising:
a pixel circuit layer including:
at least one transistor and a first electrode disposed on a substrate;
a first insulating layer disposed on the at least one transistor and the first electrode; and
a second electrode disposed on the first insulating layer and electrically connected to the at least one transistor; and
a display element layer disposed on the pixel circuit layer, the display element layer including a plurality of light emitting elements indirectly electrically connected to each of the first and second electrodes via contact electrodes, wherein
the first electrode and the second electrode are disposed on different layers and are electrically disconnected,
the plurality of light emitting elements overlap the first and second electrodes in a plan view, and
the second electrode is disposed on a layer under the plurality of light emitting elements.

19. A display device comprising:
a substrate including a plurality of pixel areas; and
a pixel provided in each of the pixel areas, wherein
the pixel comprises:
a pixel circuit layer including:
at least one transistor and a first electrode disposed on the substrate; and
a first insulating layer disposed on the at least one transistor and the first electrode; and
a display element layer disposed on the pixel circuit layer, the display element layer including:
a second electrode electrically connected to the at least one transistor; and
a plurality of light emitting elements indirectly electrically connected to each of the first and second electrodes via contact electrodes,
the first electrode and the second electrode are disposed on different layers and are electrically disconnected,
the plurality of light emitting elements overlap the first and second electrodes in a plan view and a cross-sectional view, and
the second electrode is disposed on a layer under the plurality of light emitting elements.

20. The display device according to claim 19, wherein the second electrode is disposed on the first electrode, and the first insulating layer is disposed between the second electrode and the first electrode.

* * * * *